US011600558B2

(12) United States Patent
Naeve et al.

(10) Patent No.: US 11,600,558 B2
(45) Date of Patent: Mar. 7, 2023

(54) PLURALITY OF TRANSISTOR PACKAGES WITH EXPOSED SOURCE AND DRAIN CONTACTS MOUNTED ON A CARRIER

(71) Applicant: Infineon Technologies AG, Neubiberg (DE)

(72) Inventors: Tomasz Naeve, Finkenstein (AT); Ralf Otremba, Kaufbeuren (DE); Thorsten Scharf, Lappersdorf (DE); Markus Dinkel, Unterhaching (DE); Martin Gruber, Schwandorf (DE); Elvir Kahrimanovic, Villach (AT)

(73) Assignee: Infineon Technologies AG, Neubiberg (DE)

( * ) Notice: Subject to any disclaimer, the term of this patent is extended or adjusted under 35 U.S.C. 154(b) by 335 days.

(21) Appl. No.: 16/845,304

(22) Filed: Apr. 10, 2020

(65) Prior Publication Data

US 2020/0328141 A1    Oct. 15, 2020

(30) Foreign Application Priority Data

Apr. 12, 2019  (DE) .......................... 102019109746.0
Mar. 10, 2020  (DE) .......................... 102020106492.6

(51) Int. Cl.
*H01L 23/48* (2006.01)
*H01L 21/00* (2006.01)
(Continued)

(52) U.S. Cl.
CPC .... *H01L 23/49568* (2013.01); *H01L 21/4825* (2013.01); *H01L 21/565* (2013.01);
(Continued)

(58) Field of Classification Search
CPC .......... H01L 2924/181; H01L 25/0655; H01L 25/0652; H01L 23/3107; H01L 23/4956;
(Continued)

(56) References Cited

U.S. PATENT DOCUMENTS

2001/0050429 A1   12/2001   Ashdown
2007/0161151 A1    7/2007   Madrid et al.
(Continued)

FOREIGN PATENT DOCUMENTS

DE          3416348 A1   11/1985
DE    112006003599 T5    11/2008
(Continued)

*Primary Examiner* — Alonzo Chambliss
(74) *Attorney, Agent, or Firm* — Murphy, Bilak & Homiller, PLLC

(57) ABSTRACT

A chip package is provided. The chip package includes a semiconductor chip having on a front side a first connecting pad and a second connecting pad, a carrier having a pad contact area and a recess, encapsulation material encapsulating the conductor chip, a first external connection that is free from or extends out of the encapsulation material, an electrically conductive clip, and a contact structure. The semiconductor chip is arranged with its front side facing the carrier with the first connecting pad over the recess and with the second connecting pad contacting the pad contact area. The clip is arranged over a back side of the semiconductor chip covering the semiconductor chip where it extends over the recess. The electrically conductive contact structure electrically conductively connects the first connecting pad with the first external connection.

14 Claims, 17 Drawing Sheets

(51) Int. Cl.
*H01L 23/495* (2006.01)
*H01L 23/31* (2006.01)
*H01L 21/48* (2006.01)
*H01L 21/56* (2006.01)
*H01L 25/065* (2023.01)
*H02P 27/06* (2006.01)

(52) U.S. Cl.
CPC ...... *H01L 23/3107* (2013.01); *H01L 23/3114* (2013.01); *H01L 23/49503* (2013.01); *H01L 23/49524* (2013.01); *H01L 23/49562* (2013.01); *H01L 23/49575* (2013.01); *H01L 25/0655* (2013.01); *H01L 2924/181* (2013.01); *H02P 27/06* (2013.01); *H02P 2201/03* (2013.01)

(58) Field of Classification Search
CPC .......... H01L 23/3114; H01L 23/49503; H01L 23/49524; H01L 23/49562; H01L 21/4825; H01L 21/565; H01L 23/49575
See application file for complete search history.

(56) References Cited

U.S. PATENT DOCUMENTS

| | | |
|---|---|---|
| 2007/0206357 A1 | 9/2007 | Hellinger et al. |
| 2009/0057878 A1 | 3/2009 | Gomez |
| 2011/0101466 A1* | 5/2011 | Wu ..................... H01L 21/4814 257/288 |
| 2013/0003309 A1* | 1/2013 | Stella ..................... H01L 24/32 361/715 |
| 2013/0146991 A1* | 6/2013 | Otremba ................. H01L 24/96 438/109 |
| 2014/0110788 A1* | 4/2014 | Cho ................. H01L 23/49575 257/368 |
| 2015/0162261 A1* | 6/2015 | Cho ................. H01L 23/49562 257/329 |
| 2015/0194373 A1* | 7/2015 | Otremba ................. H01L 24/40 257/676 |
| 2019/0067251 A1 | 2/2019 | Bando et al. |

FOREIGN PATENT DOCUMENTS

| | | |
|---|---|---|
| DE | 112016005794 T5 | 8/2018 |
| EP | 1750490 A1 | 2/2007 |
| EP | 2043412 A1 | 4/2009 |
| WO | 9921402 A1 | 4/1999 |
| WO | 2018138530 A1 | 8/2018 |

* cited by examiner

FIG. 1
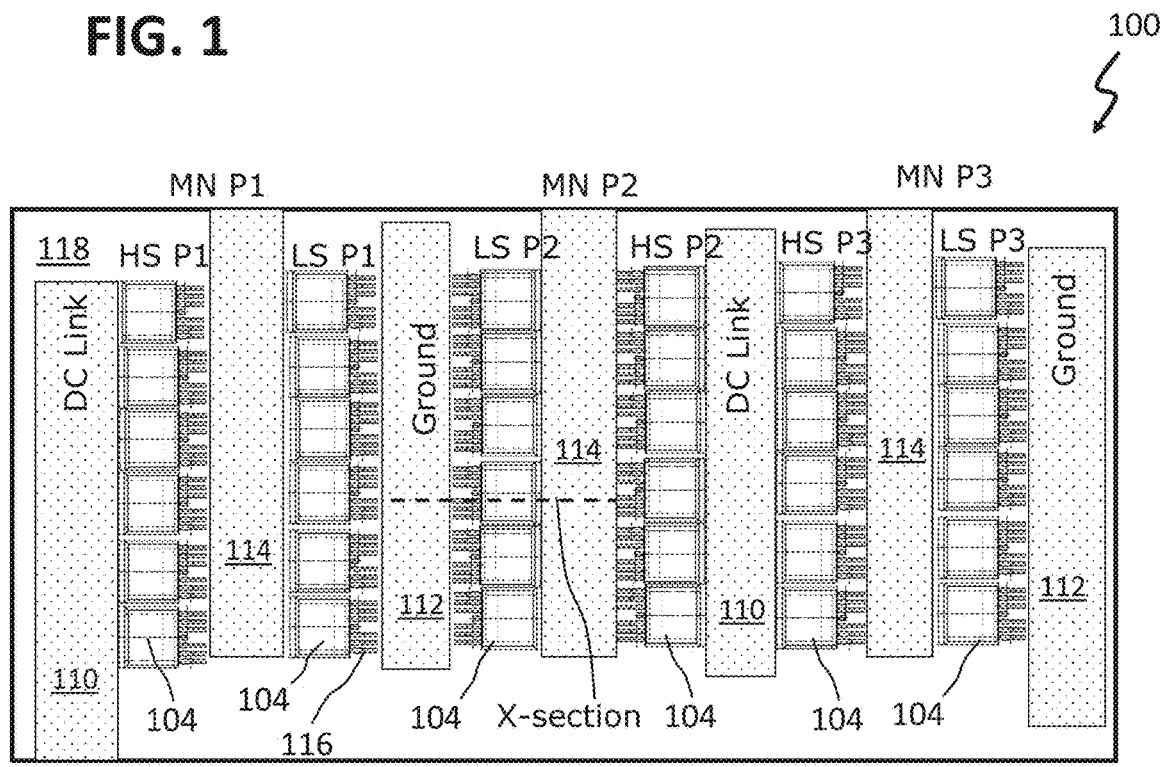
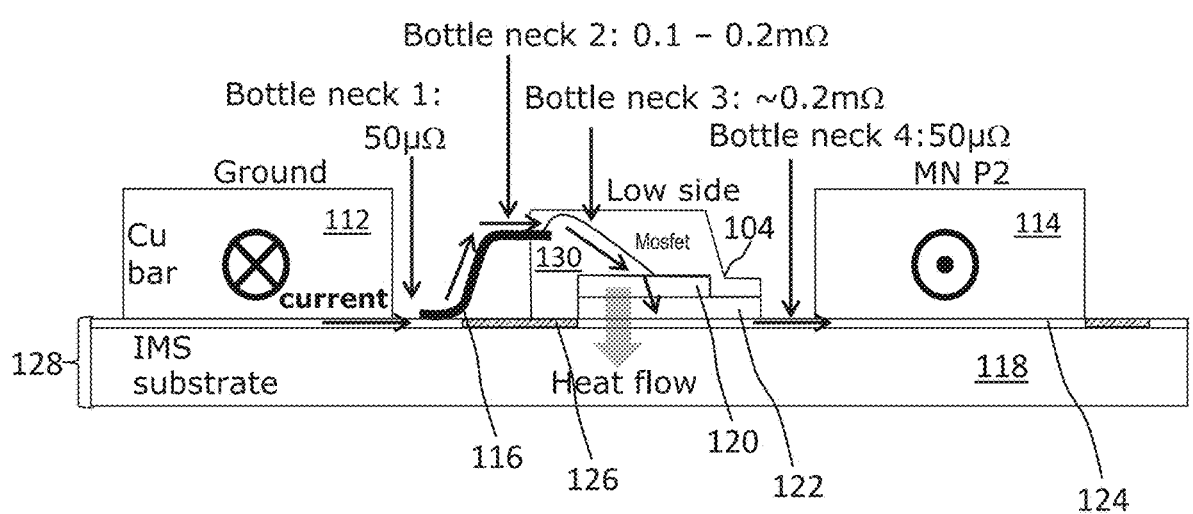

FIG. 3
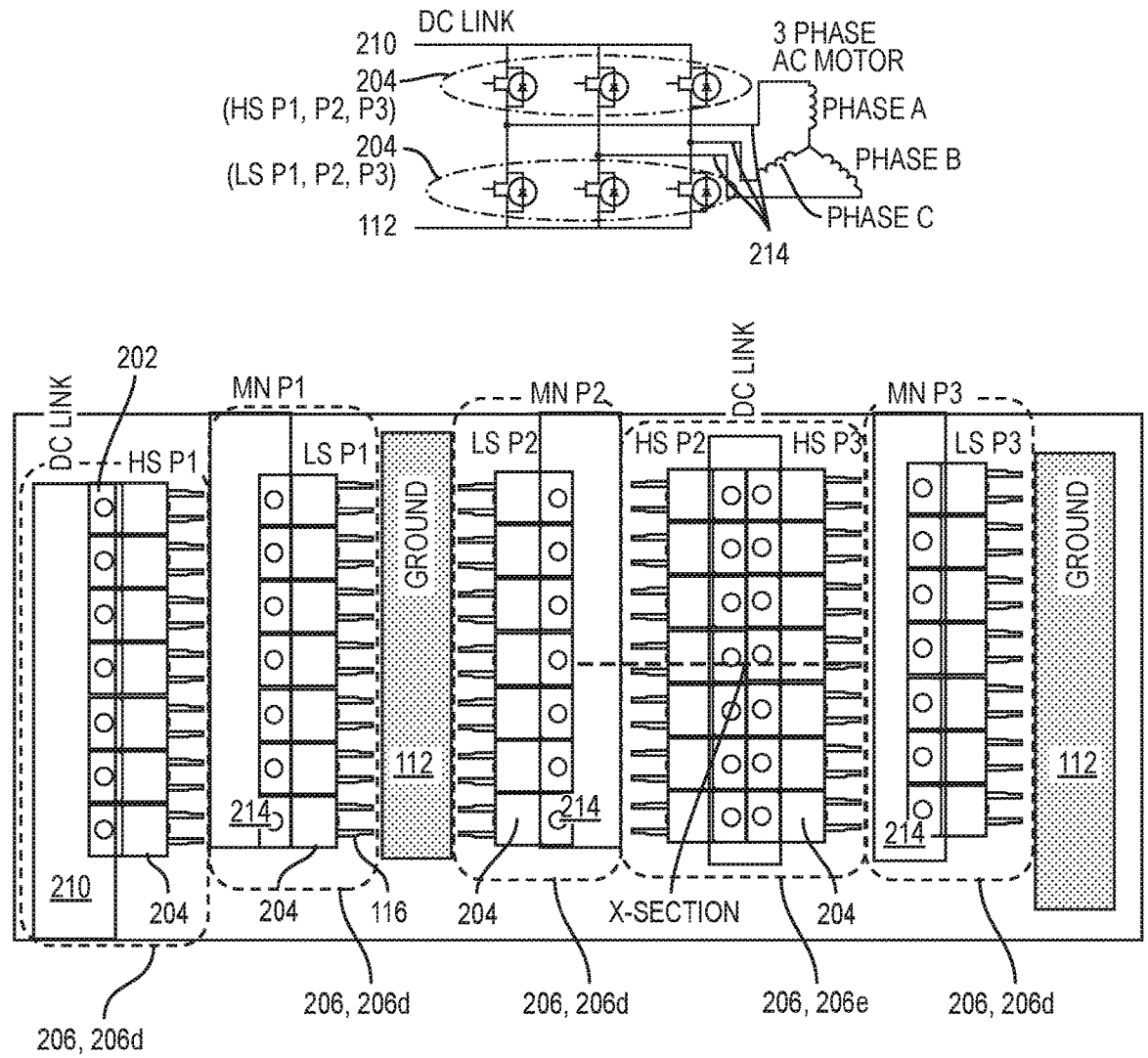
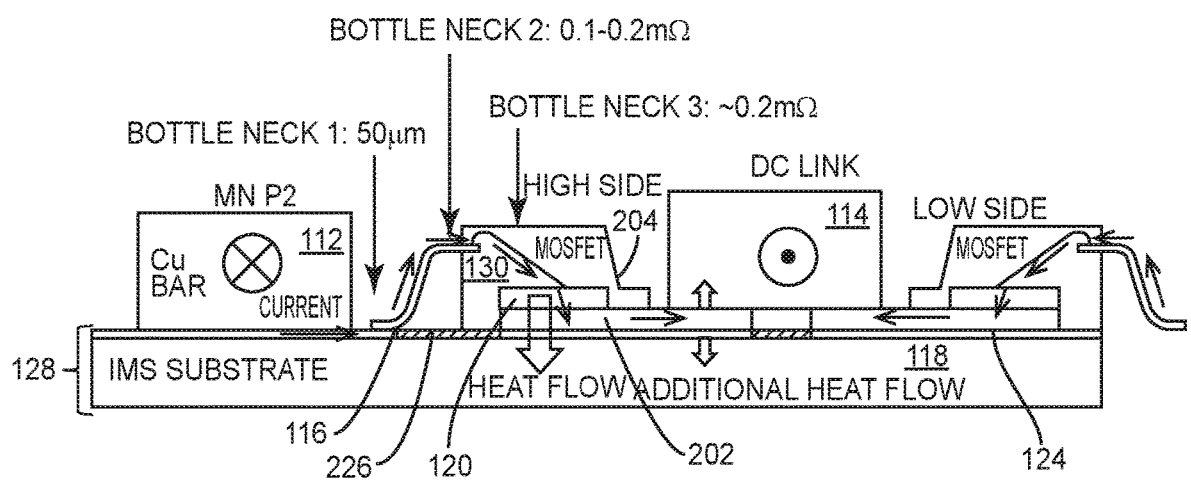

410 mounting a plurality of semiconductor chip packages onto a carrier, wherein the carrier comprises an electronic circuit, and each of the chip packages comprises an encapsulation encapsulating the semiconductor chip, a plurality of contact structures electrically connecting the semiconductor chip with the electronic circuit, and at least one cooling structure protruding from the encapsulation

420 thermally conductively connecting a cooling element to at least one cooling structure of each of at least two of the plurality of semiconductor chip packages

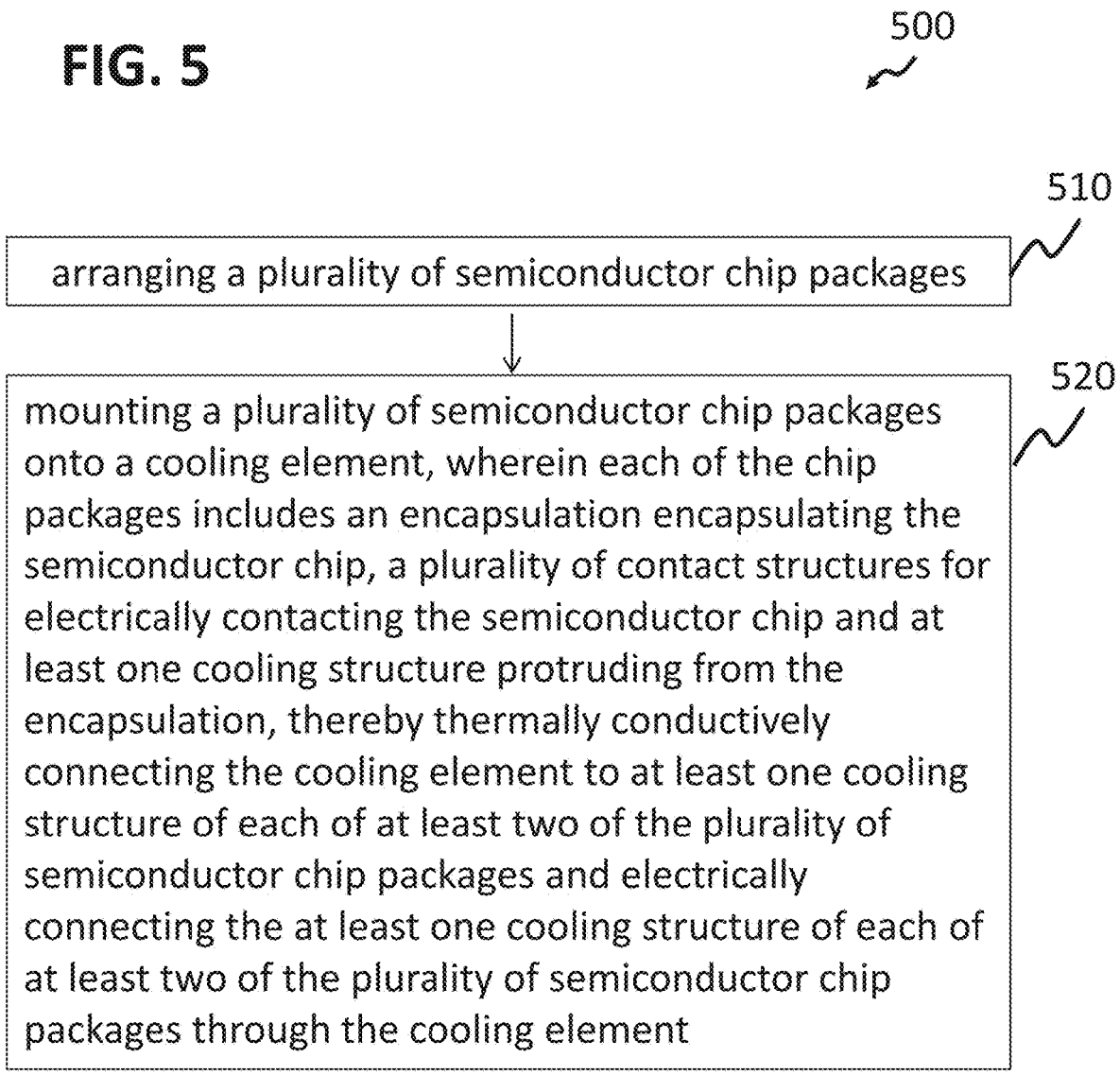

FIG. 6B
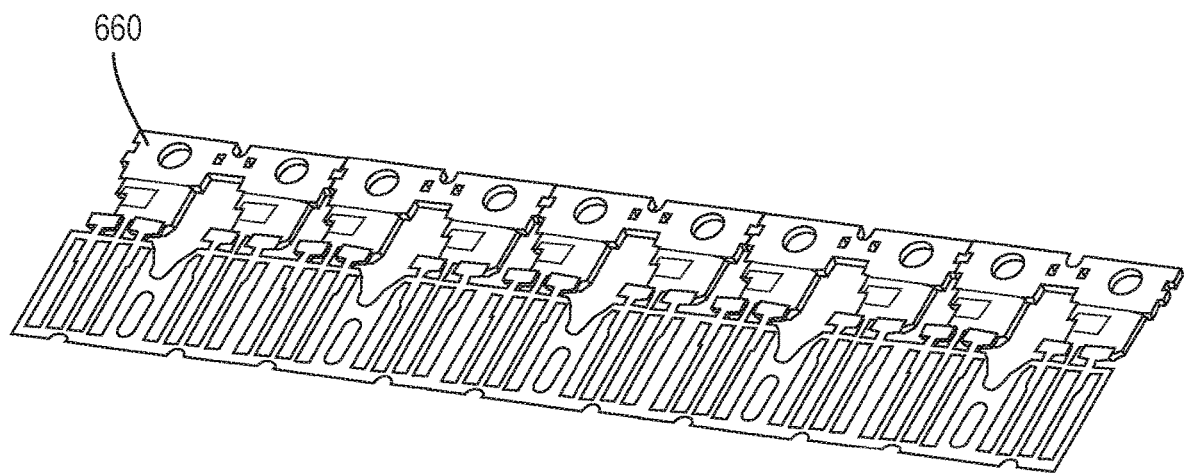
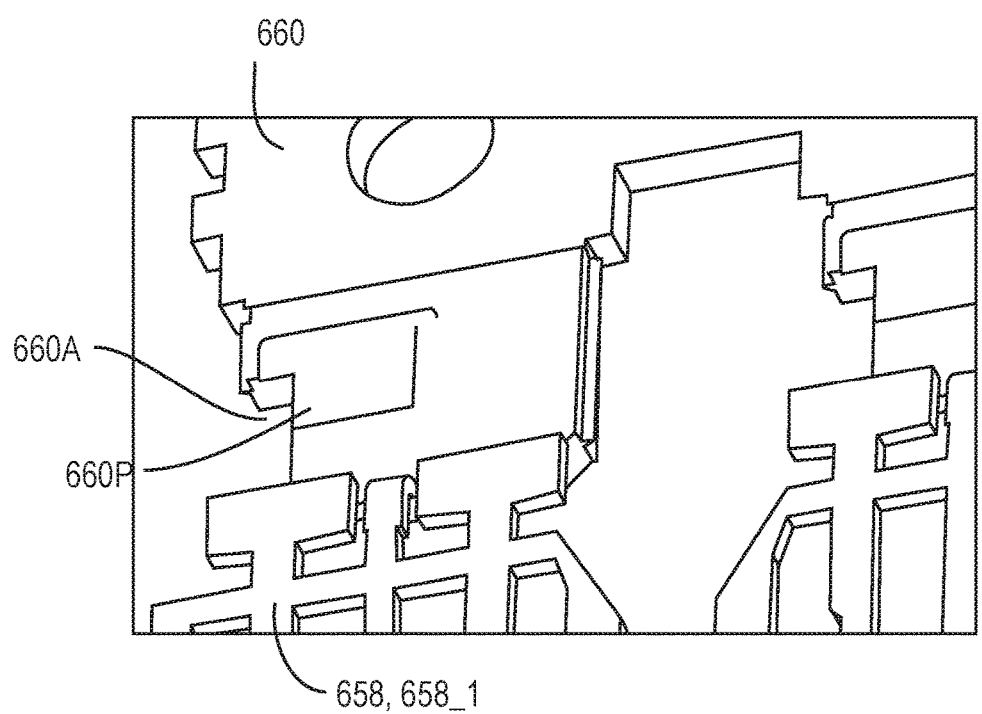

FIG. 6C
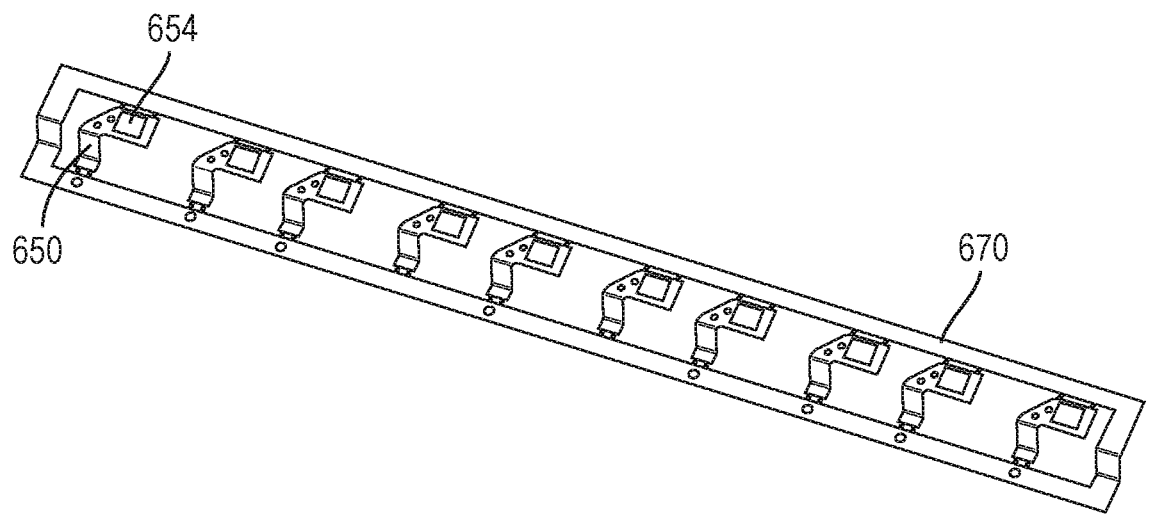
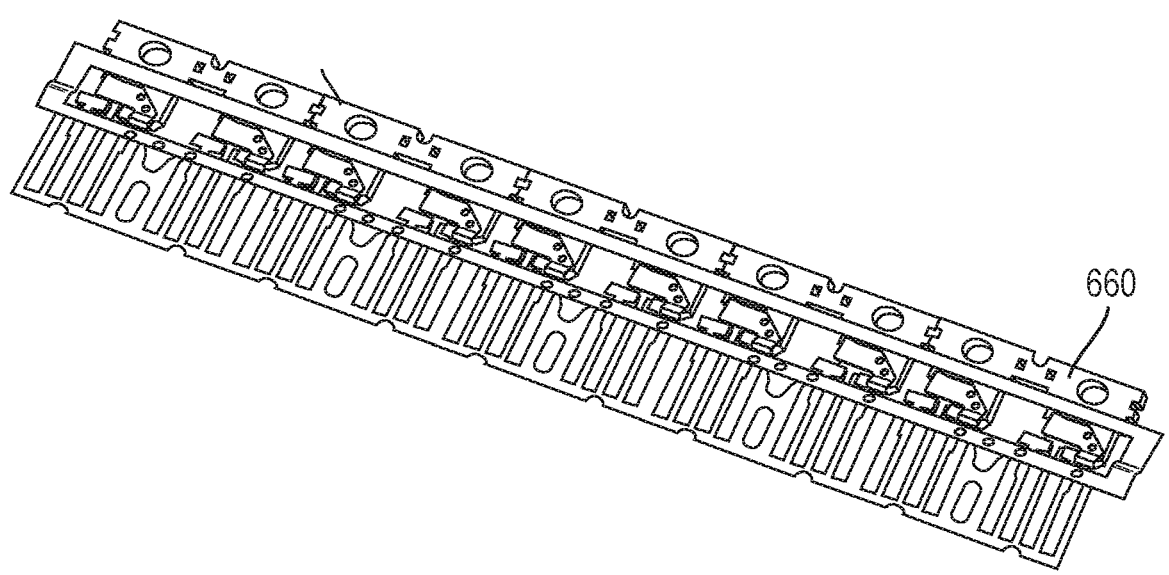

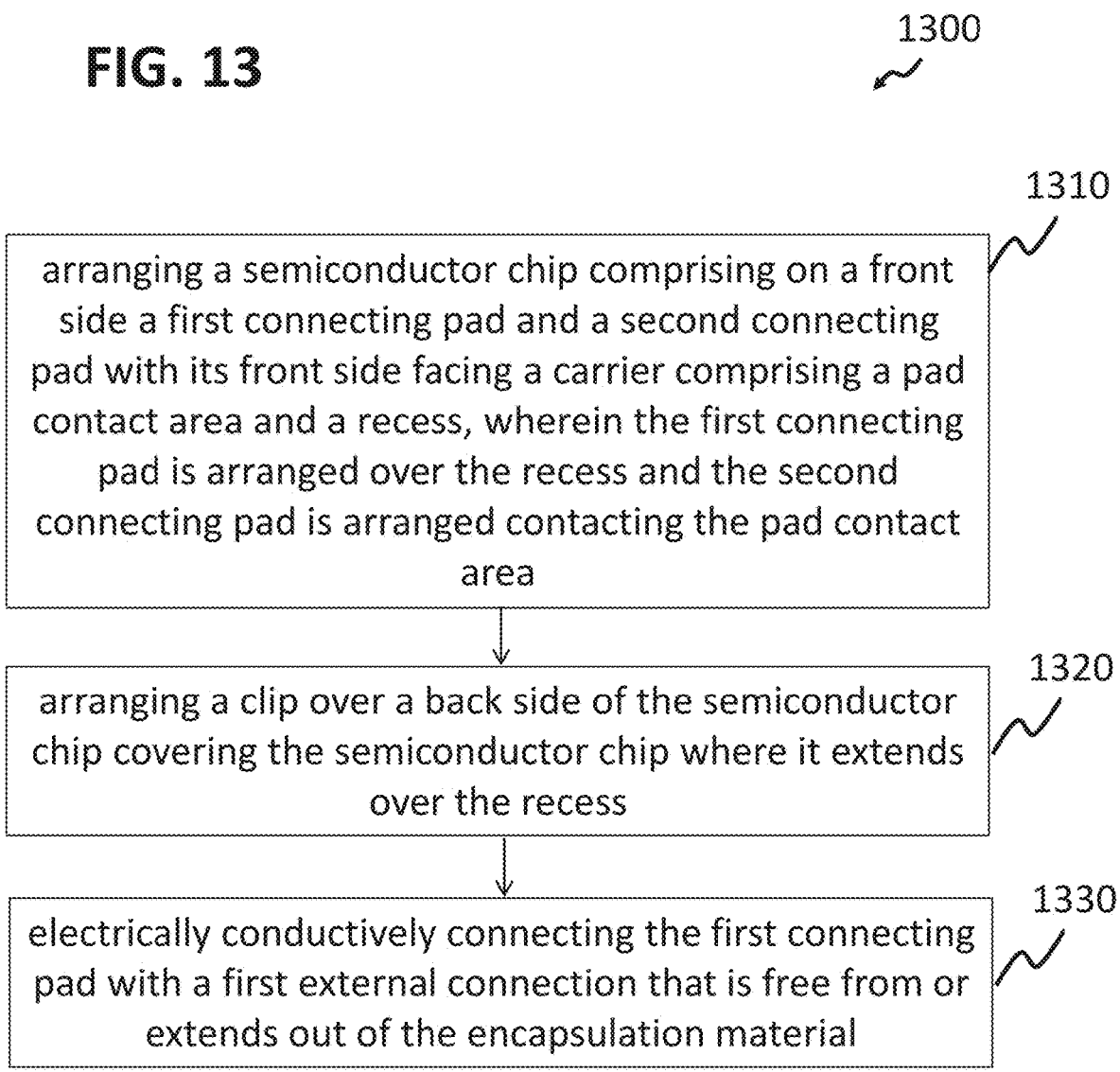

PLURALITY OF TRANSISTOR PACKAGES WITH EXPOSED SOURCE AND DRAIN CONTACTS MOUNTED ON A CARRIER

TECHNICAL FIELD

Various embodiments relate generally to a semiconductor device, a semiconductor arrangement, a three-phase-system, a method of forming a semiconductor device, and a method of forming a semiconductor arrangement.

BACKGROUND

Packaged surface mount devices (SMD packages) that include semiconductor chip are often used in high current devices. The SMD packages may generate a considerable amount of heat during operation. The heat that is generated in the semiconductor chip may have to be dissipated to an outside of the package as efficiently as possible.

However, at present, all SMD packages (power and standard) rely only on a bottom side cooling, for example by mounting the SMI) package on a printed circuit board (PCB) that has a high thermal conductivity, e.g. an insulated metal substrate (IMS).

SUMMARY

A chip package is provided. The chip package may include a semiconductor chip comprising on a front side a first connecting pad and a second connecting pad, a carrier comprising a pad contact area and a recess, encapsulation material encapsulating the semiconductor chip, a first external connection that is free from or extends out of the encapsulation material, an electrically conductive clip, and a contact structure, wherein the semiconductor chip is arranged with its front side facing the carrier with the first connecting pad over the recess and with the second connecting pad contacting the pad contact area, wherein the clip is arranged over a back side of the semiconductor chip covering the semiconductor chip where it extends over the recess, and wherein the electrically conductive contact structure electrically conductively connects the first connecting pad with the first external connection.

A semiconductor device is provided. The semiconductor device may include a carrier including an electronic circuit, a plurality of semiconductor chip packages mounted on the carrier, wherein each of the chip packages includes an encapsulation encapsulating the semiconductor chip, a plurality of contact structures electrically connecting the semiconductor chip with the electronic circuit, and at least one cooling structure protruding from the encapsulation, and a cooling element thermally conductively connected to at least one cooling structure of each of at least two of the plurality of semiconductor chip packages.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in FIG. 1 shows a schematic top view (top) and a schematic cross-sectional view (bottom) of a position indicated in the top view of a three-phase motor driver as known in the art;

FIG. 3 shows a schematic circuit (top), a schematic top view (middle), and a schematic cross-sectional view (bottom) of a position indicated in the top view of a three-phase motor driver in accordance with various embodiments;

FIG. 4 shows a flow diagram of a method of forming a semiconductor device;

FIG. 5 shows a flow diagram of a method of forming a semiconductor arrangement;

FIG. 6A to 6C show schematic perspective views of a chip package in accordance with various embodiments and of elements for forming the chip package;

FIG. 13 shows a flow diagram of a method of forming a chip package in accordance with various embodiments.

DETAILED DESCRIPTION

Figure 2:
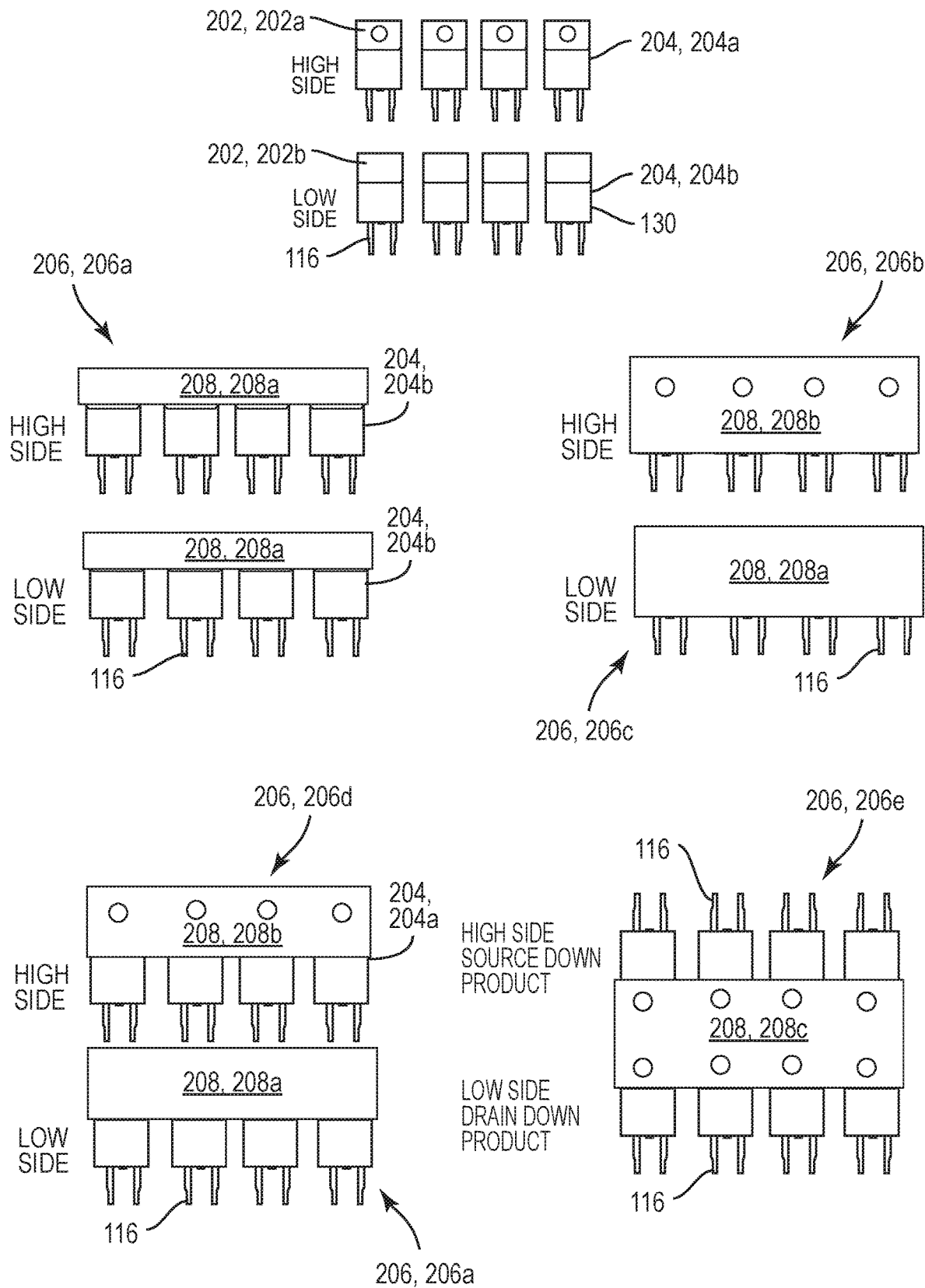
FIG. 2 shows a schematic top views of several semiconductor arrangements in accordance with various embodiments, and semiconductor chip packages as used in the semiconductor arrangements.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

For various elements, devices, arrangements etc., a common reference number may be used, e.g. semiconductor arrangements 206, semiconductor devices 204, etc. For distinguishing different embodiments, examples etc., different small letters are appended to the respective reference numbers, e.g. semiconductor arrangements 206a, 206b, and 206c, etc.

FIG. 1 shows a schematic top view (top) and a schematic cross-sectional view (bottom) of a position indicated in the top view of a three phase motor driver 100 as known in the art.

A circuit diagram of a three phase motor driver is shown in FIG. 3 (top) and may also apply to the three-phase motor driver 100 of FIG. 1. A typically used electrical circuit for the motor driver 100 application is a three phase inverter, which may include three MOSFET half bridges, suppling energy to the electric motor (of which only the inductive coils are shown and labelled as "Phase A", "Phase B", and "Phase C"). An example for an application of such a motor may be an electrical forklift vehicle with an effective current $I_{RMS}$ of, for example, up to about 1000 A. In order to handle such a high current, a device paralleling may be required. For the exemplary forklift, up to 28 MOSFETs may be used in parallel for each of the individual MOSFETs shown in FIG. 3 (top), resulting in 6×28=168 MOSFETs in total. In the top view of FIG. 1, six MOSFETS are used in parallel for each individual MOSFET in the circuit diagram, resulting in a total of 36 MOSFETs.

For a circuit like this, at present, insulated metal substrate (MS) based circuit boards with good thermal properties are typically used. Occasionally, FR4 based printed circuit boards (PCBs) may be used. In order to handle the high currents on the boards, copper (Cu) bars 110, 112, 114 as schematically shown in FIG. 1 may sometimes be used. However, a large amount of heat may be generated by the high current. The heat that may be generated within the power MOSFETs may need to be dissipated to the ambient as efficiently as possible.

As can be seen in the schematic cross-sectional view of FIG. 1 (bottom), a presently used configuration of the motor driver 100 may have at least one electrical "bottle neck", at a position labelled as "Bottle neck 4: 50 µΩ", in a dielectric layer of the carrier 118/124. The label indicates that the electrical bottle neck corresponds to a portion of the circuit 100 that has a relatively high package and parasitic board resistance, and a corresponding parasitic inductance. Furthermore, a heat flow, as indicated by the grey arrow, occurs essentially only in one direction: From a packaged chip 120 through an electrically conductive chip carrier 122 into the carrier 118/124.

In various embodiments, a surface mounted device (SMD) package with a heat-spreader is used. The SMD package with the heat spreader may enable an improved bottom side cooling. Alternatively or additionally, a top side cooling may be used. As a consequence, an overall thermal performance of the system may be improved, for example because a heat flow from the SMD to the carrier is improved.

In various embodiments, the heat spreader may be provided as a so-called thermal extension, e.g. as a so-called drain tab.

An exemplary embodiment of a semiconductor device 200 that uses such an SMD package 204 (or rather, a plurality of such SMD packages 204) is shown in FIG. 3, which shows a schematic circuit 300 (top), a schematic top view (middle), and a schematic cross-sectional view (bottom) of a position indicated in the top view of the semiconductor device 200 (in this specific example, a three phase motor driver) accordance with various embodiments. In the semiconductor device 200, semiconductor chip packages 204 (also referred to as chip packages or simply packages) that are grouped together as semiconductor arrangements 206 are used.

In FIG. 2, various exemplary embodiments of semiconductor arrangements 206 in accordance with various embodiments, and semiconductor chip packages 204 as used in the semiconductor arrangements 206 are shown. Each of the chip packages 204 may include at least one semiconductor chip 120. The semiconductor chip 120 may have a front side having at least one chip contact. In FIG. 3 (bottom), only a lead contacting the chip contact is shown, but not the chip contact itself. The semiconductor chip 120 may further have a back side opposite the front side. The back side may form a further contact of the semiconductor chip 120, e.g. a drain contact. Alternatively, the back side may be electrically insulating and only thermally conductive.

In various embodiments, a semiconductor arrangement 206 may include a cooling element 208 and a plurality of semiconductor chip packages 204 mounted on the cooling element 208. Each of the chip packages 204 may include an encapsulation 130 encapsulating the semiconductor chip 120, a plurality of contact structures 116 for electrically contacting the semiconductor chip 120 (from an outside of the chip package 204), and at least one cooling structure 202 protruding from the encapsulation 130. The cooling element 208 may be thermally conductively connected to at least one cooling structure 202 of each of at least two of the plurality of semiconductor chip packages 204

The at least one cooling structure 202 may in various embodiments be directly connected to the semiconductor chip 120. For example, the semiconductor chip 120 may be mounted on the cooling structure 202 with its back side, e.g. bonded (for example soldered, glued, or sintered) to the cooling structure 202 with the back side.

In various embodiments, the cooling structure 202 may be electrically conductive. The cooling structure 202 may for example include or consist of one or more metals, e.g. aluminum, copper, an aluminum alloy and/or a copper alloy.

Each of the semiconductor chip packages 204 may in various embodiments form a transistor, e.g. a MOSFET or an IGBT, or a diode. The semiconductor chip packages 204 may for example be power semiconductor devices, e.g. power transistors or power diodes.

In various embodiments, e.g. in a case of the semiconductor chip packages 204 forming transistors, each of the plurality of contact structures 116 may include at least one controlling contact structure and at least one controlled contact structure.

The cooling structure 202 may form a further controlled contact structure, for example in a case of the back side of the semiconductor chip 120 forming a controlled chip contact and the cooling structure202 being electrically conductive.

In various embodiments, the at least one cooling structure 202 of each of at least two of the plurality of semiconductor chip packages 204 may be electrically connected through the cooling element 208.

FIG. 2 shows various exemplary embodiments of how this may be achieved if both, the cooling structures 202 and the cooling element 208, are electrically conductive, and the cooling structures 202 are electrically connected to the cooling element 208.

The cooling element 208 may for example include or consist of one or more metals, e.g, aluminum, copper, an aluminum alloy and/or a copper alloy.

Each of the plurality of semiconductor chip packages 204 may be mounted on the cooling element 208. in various embodiments, the semiconductor chip packages 204 may be mounted on the cooling element 208 only with the cooling structure 202, as for example shown in the semiconductor arrangements 206a, 206d, and 206e. In other embodiments, the semiconductor chip packages 204 may be mounted on the cooling element 208 with the cooling structure 202 and with the encapsulation 130, as for example shown in the semiconductor arrangements 206b and 206c.

The encapsulation 130 may for example include or consist of a mold material or a laminate.

The plurality of semiconductor chip packages 204 may be surface mounted devices. This means that the semiconductor chip packages 204 may be configured to have their contact structures 116 attached to a surface of a carrier 128 including an electronic circuit 124, e.g. a printed circuit board (PCB, see e.g. FIG. 3, bottom) or an insulated metal substrate (IMS) with the circuit 124 arranged thereon, rather than having the contact structures protrude through an opening in the carrier 128.

In various embodiments, as can be seen in the cross-sectional view of FIG. 3, the semiconductor chip packages 204 may be (surface-)mounted to the carrier 128 with the cooling structure 202 thermally and electrically contacting the carrier 128. The electrical contact may be to the circuit 124. The circuit 124 may include or consist of leads, e.g. metal leads, separated by electrically insulating portions 226.

In other words, the semiconductor chip packages 204 may be (surface-)mounted to the carrier 128 in such a way that the respective cooling structure 202, which may be a contact structure of the semiconductor chip package 204 and which may be exposed on a bottom side of the chip package 204, may electrically contact the circuit 124, in this case with a bottom side of the cooling structure 202.

The cooling element 208 may in various embodiments be mounted to a top side of each of the cooling structures 202.

In various embodiments, multiple cooling structures 202 may be provided in each chip package 204. It may be sufficient if only one of the cooling structures 202 per chip package 204 is connected to the cooling element 208.

A thermal connection between the plurality of cooling structures 202 and the cooling element 208 may in various embodiments be formed by soldering, gluing, sintering, or the like, or by screwing, or by a combination thereof, e.g. screwing in combination with an electrically conductive glue. The thermal connection may, at the same time, form an electrically conductive connection.

For enabling the screwing connection, the cooling structure 202, e.g. a cooling tab, may be provided with an opening, e.g. a hole 220, e.g. a threaded hole. The cooling element 208 may be provided with a corresponding opening, e.g. hole (not shown in FIG. 2, because the opening is filled and covered by screws 222).

As shown in FIG. 2, for example in the semiconductor arrangements 206a, 206b, 206c, 206d, and 206e, the plurality of semiconductor chip packages 204 may be arranged as at least one row, for example as a single row (in the semiconductor arrangements 206a, 206b, 206c, and 206d), or as a combination of a first row and of a second row. "Arranged" in this context may be understood as referring to the way in which the semiconductor chip packages 204 are mounted on the cooling element 208.

Exemplary embodiments for combinations of two semiconductor arrangements 206, 206a together forming a semiconductor arrangement 206, 206e, 206f having two rows of semiconductor chip packages 204 and two cooling element portions 208 are shown in FIG. 2 and FIG. 3. The cooling element 208 may include a first cooling element portion thermally coupled to the cooling structures 202 of the semiconductor chip packages 204 of the first group, and a second cooling element portion thermally coupled to the cooling structures 202 of the semiconductor chip packages 204 of the second group.

The semiconductor arrangements 206, 206e, 206f may for example themselves be considered a semiconductor arrangement 206 because the semiconductor arrangement form a functional arrangement, e.g. one of the semiconductor arrangements 206a being connected to a high side of a circuit and the other semiconductor arrangement 206a being connected to a low side of the circuit, e.g. as shown in the circuit 300 of FIG. 3). In the semiconductor arrangement 206e, the two cooling element portions of the cooling element 208 may be integrally formed.

In various embodiments, all of the semiconductor chip packages 204 of the first group may be arranged with the same first orientation. If present, the semiconductor chip packages 204 of the second group may be arranged with the same second orientation, which may be the same as the first orientation or different from the first orientation. As shown in FIG. 2 for the semiconductor arrangement 206e, the first group may be arranged with each of the chip packages 204 with their source contact being exposed at the bottom ("source down product"), and the second group may be arranged with each of the chip packages 204 with their drain contact being exposed at the bottom ("drain down product").

In various embodiments, the cooling element 208 may be configured to perform a further function besides cooling, for example the cooling element 208 may include an electrically conductive coil.

In various embodiments, the cooling structure 202 may have an arbitrary shape, as long as it is compatible with the cooling function to be provided for the chip package 204. In the embodiments shown in FIG. 2 and FIG. 3, the cooling structure 202 may be a (e.g. rectangular) cooling tab 202a, 202b, wherein the cooling tab 202a may be provided with the opening 220 for screwing the cooling structure 202 to the cooling element 208, and the cooling tab 202b may be provided without the opening 220. In other embodiments, the cooling structure 202 (not shown), the cooling structure 202 may have multiple segments, a three-dimensional structure, e.g. with one or more fins extending from a plane, with a clip-like structure for clipping on to the cooling element 208, or the like.

In various embodiments, as shown in FIG. 3, a plurality of semiconductor arrangements 206 may be integrated in a semiconductor device 200.

The semiconductor device 200 may include a carrier 128 including an electronic circuit 124 (conductive lines/traces 124 formed in or on the carrier 128), and a plurality of semiconductor chip packages 206 mounted on the carrier 128. Each of the chip packages 206 may include an encapsulation 130 encapsulating the semiconductor chip 120, a plurality of contact structures 116 electrically connecting the semiconductor chip 120 with the electronic circuit 124, and at least one cooling structure 202 protruding from the encapsulation 130, and a cooling element 108 thermally conductively connected to at least one cooling structure 202 of each of at least two of the plurality of semiconductor chip packages 206.

As shown in the cross-sectional view of FIG. 3, in particular in comparison with FIG. 1, the cooling structure 202 and the cooling element 208 thermally conductively connected to it may allow an additional heat flow 332 through the cooling structure 202 into the cooling element 208, and the thermal connection between the cooling structure 202 and the carrier 128 may allow a further additional heat flow 334 through the cooling structure 202 into the carrier 128. In other words, a top side cooling (heat flow 332) or a double side cooling (through heat flows 332 and 334) may additionally be made possible.

In a case of the cooling structure 202 and the cooling element 208 being electrically conductive, in particular in a case of each of the cooling structures 202 being electrically coupled with the semiconductor chip 120 and with the electronic circuit 124, thereby forming a further contact structure, an amount of current (indicated by thin black arrows in both, FIG. 1 and FIG. 3) that may be conducted through the semiconductor device 200 may be increased. In particular, the "Bottle neck 4" of FIG. 1 may be avoided. A thermal resistance and/or thermal impedance, e.g. the resistances junction-to-ambient, may be reduced, without requiring additional carrier (e.g. PCB) space. In experiments, a junction-to-carrier thermal resistance $R_{thjc}$ was improved by up to 20%, even without an additional cooling element 208. If the cooling element 208 is provided as an additional heat sink, an improvement to the junction-to-carrier thermal resistance $R_{thjc}$ will be when larger than 20%.

Furthermore, a power dissipation performance may be increased, thereby increasing the power density, and a parasitic inductance and resistance may be slightly reduced In particular in embodiments using the source down and/or the drain down semiconductor arrangements, and using the metal (e.g. Cu) bar as an additional heat sink, a source inductance and board resistance (one bottle neck less) may be improved and a power density may be increased.

The semiconductor device 200 may thus be suitable to form a power semiconductor device. This terminology may also apply to each of the chip packages 204, which themselves may form power devices, e.g. (power) MOSFETs, (power) IGBTs, or (power) diodes.

As shown in the exemplary embodiment of FIG. 3, the semiconductor device 200 may form or be part of half-bridges. In other words, the electronic circuit 124 and the plurality of semiconductor chip packages 204 may be connected to include (e.g. parallel) half-bridges. As may be seen in the schematic circuit 300 on the top of FIG. 3, the semiconductor device may form a three-phase system including a plurality of half-bridges, in this case a motor driver. The motor itself is not shown in the schematic view in the middle of FIG. 3, but each of the plurality of semiconductor arrangements 206 includes a plurality of semiconductor devices 204 that are thermally and electrically connected in groups by a plurality of cooling elements 208 (e.g. copper bars). Specifically, the semiconductor arrangement 206a as shown in FIG. 2 is used (in each of the groups of semiconductor arrangements 206a, the semiconductor devices 204 are arranged with the same orientation, and the cooling element 208 is attached by gluing, soldering, sintering or the like), and further a semiconductor arrangement 206g, which is similar to the semiconductor arrangement 206e of FIG. 2, but with the cooling element 208 being attached by gluing, soldering, sintering or the like, instead of screwing. Of course, other embodiments of the semiconductor arrangements 206 may be used in the semiconductor device 200 instead of the ones shown. The motor driver may be used in high-power applications, for example in an electrical forklift or the like.

In various embodiments, the electronic circuit 124 and the plurality of semiconductor chip packages 204 may be connected to form or include a full-bridge.

FIG. 4 shows a flow diagram 400 of a method of forming a semiconductor device.

The method may include mounting plurality of semiconductor chip packages onto a carrier (in 410), wherein the carrier includes an electronic circuit, and each of the chip packages includes an encapsulation encapsulating the semiconductor chip, a plurality of contact structures electrically connecting the semiconductor chip with the electronic circuit, and at least one cooling structure protruding from the encapsulation, and thermally conductively connecting a cooling element to at least one cooling structure of each of at least two of the plurality of semiconductor chip packages (in 420).

The mounting of the plurality of semiconductor chip packages may include surface-mounting the semiconductor chip packages to the carrier (e.g. a PCB or an IMS), for example by known surface mounting techniques.

The mounting of the chip packages may in various embodiments be performed in such a way that, before the mounting, a first group of the semiconductor chip packages may be arranged forming a first row. All of the semiconductor chip packages of the first group may be arranged with the same first orientation.

The cooling element may include a first cooling element portion, and it may be thermally coupled to the cooling structures of the semiconductor chip packages of the first group with said first cooling element portion.

Similarly, before the mounting, a second group of the semiconductor chip packages may be arranged forming a second row. All of the semiconductor chip packages of the second group may be arranged with the same second orientation, which may be identical to the first orientation, or different from the first orientation.

The cooling element may include a second cooling element portion, which may be thermally coupled to the cooling structures of the semiconductor chip packages of the second group.

The thermally conductively connecting the cooling element may include soldering, gluing or sintering the cooling element to the at least one cooling structure of each of the at least two of the plurality of semiconductor chip packages. Other known suitable methods for thermally conductively connecting the cooling element to the cooling structure may be employed. In various embodiments, the cooling element and the cooling structure may be mechanically connected. For example, the cooling structures may include an opening, and the cooling element may be screwed onto the cooling structures. Alternatively, a clipping mechanism may be used.

FIG. 5 shows a flow diagram 500 of a method of forming a semiconductor arrangement.

The method may include arranging a plurality of semiconductor chip packages (in 510) and mounting the plurality of semiconductor chip packages onto a cooling element, wherein each of the chip packages includes an encapsulation encapsulating the semiconductor chip, a plurality of contact structures for electrically contacting the semiconductor chip and at least one cooling structure protruding from the encapsulation, thereby thermally conductively connecting the cooling element to at least one cooling structure of each of at least two of the plurality of semiconductor chip packages and electrically connecting the at least one cooling structure of each of at least two of the plurality of semiconductor chip packages through the cooling element (in 520).

Power transistors, which are often integrated in power applications as transistor outline packages, face a dilemma in that on the one hand, a cooling could be optimized if one surface was directly connected with the outside world, whereas on the other hand an electrically conductive connection could jeopardize an electromagnetic compatibility or a safety insulation. However, in many cases it would be possible to connect one of the potentials, like the source of the low-side switch, which is usually LOW potential anyhow, to a heat sink or a different type of heat distribution.

A usual way is to insulate an exposed pad of the transistor electrically from the heat sink. This deteriorates a thermal performance and therefore forms a limitation of a power density that can be achieved by the (power) transistor.

In a so-called source down transistor package, a source contact of the transistor may be exposed at a bottom/back side of the package.

Concepts that may enable the source-down package already in chip technology, e.g. in frontend, may require significant technological effort. Source down concepts in backend may either be expensive or require special packages.

In various embodiments, a simple to implement source down chip package for a power transistor with an almost standard package outline is provided. The chip package may support highest electrical performance.

In various embodiments, a source down power package in standard outline with gate wire bond on a leadframe side and with a drain clip is provided.

In various embodiments, a carrier, e.g. a leadframe, may include a die pad (in this case, a source pad), to be contacted with a source contact of the transistor chip. A portion, e.g. a corner, of the die pad may be removed, e.g. stamped away or etched away, to form a recess and thereby gain space for a gate contact of the transistor chip.

The chip may be arranged source down on the die pad with the source contact electrically and physically contacting the source pad, while the gate pad is arranged over the recess.

A clip may then be placed on a backside of the chip. The clip may electrically connect a drain contact (potential) of the chip to an external connector (lead) and may support the chip over most of the chip area, in particular over the recess where the gate contact is arranged, in other words it may support the free hanging gate pad.

An electrical connection of the gate pad, e.g. to an external connector, may be achieved by e.g. wire bonding, which is performed on the source side of the chip, which is different from the side typically used in prior art transistor packages. The wire may connect the bottom side of the gate lead, e.g. to the external connector.

The clip arranged over the drain side of the chip, in particular over the free hanging gate pad, may provide the support that may be required for applying the wire to the gate pad, e.g. for the wire bonding process.

After a subsequent encapsulation process, the package may, except for the recess that may be revealed by a shape of an interface between the carrier and an encapsulation material, resemble a standard transistor outline package.

Standard power packages with exposed pads that may be suitable for the above described modification to form a so-called source-down chip package may for example include TO220, TO247, TO-Leadless, TO263, TO252, TDSON, and QDPAK. In this context, "source down" is to be understood as "source towards exposed pad" (rather than a direction in the figures, in relation to a board, or with respect to gravity), This may lead to a configuration, for example for SMD packages like DDPAK and QDPAK, in which a source pad of the "source down" chip package is arranged with the source pad facing away from a circuit board.

Figure 6A:
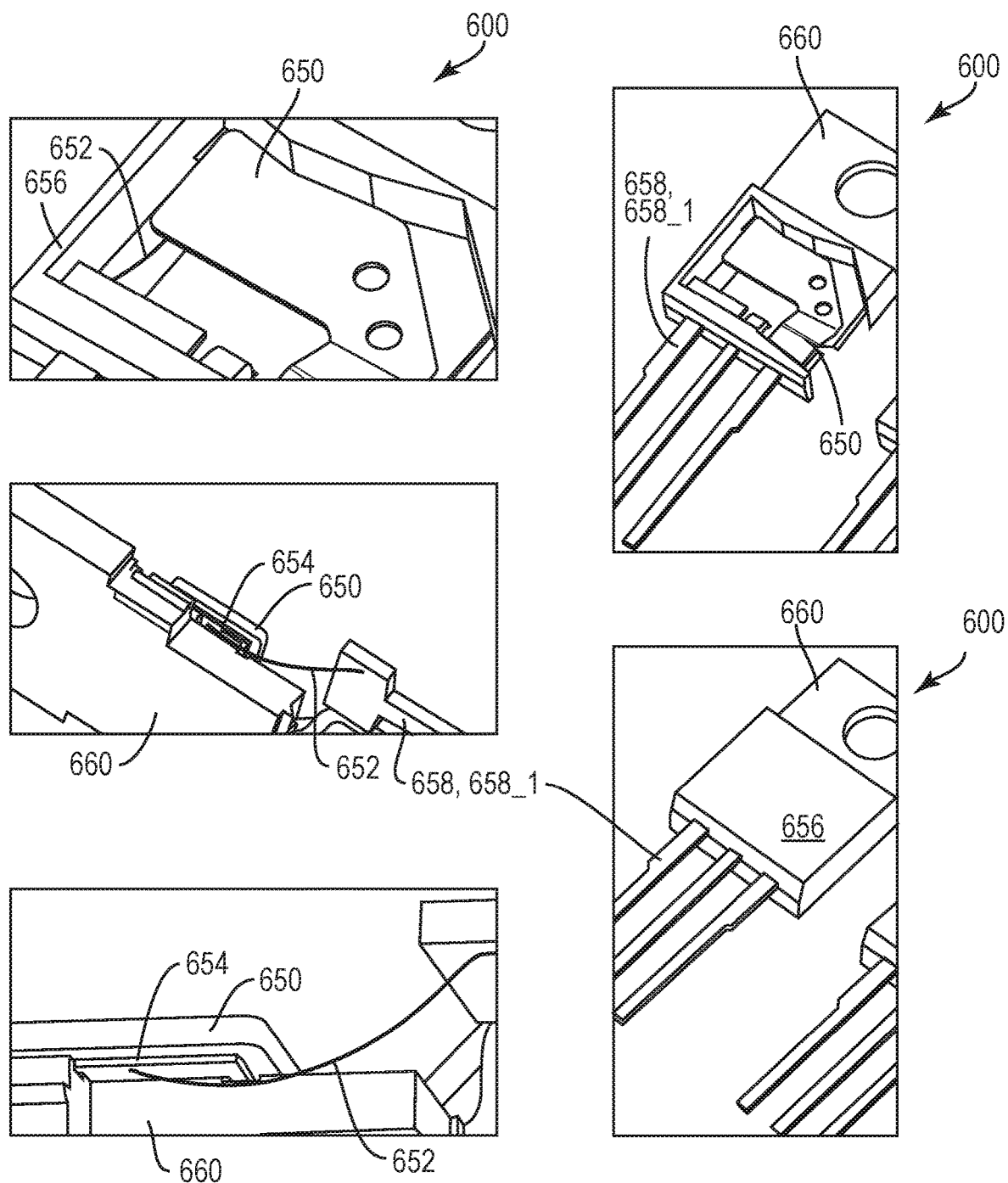

FIG. 6A to 6C show schematic perspective views of a chip package 600 in accordance with various embodiments and of elements for forming the chip package 600. Each of FIGS. 7A and 7B visualizes a process 700 and 701, respectively, of forming a chip package 600 in accordance with various embodiments.

Figure 7A:
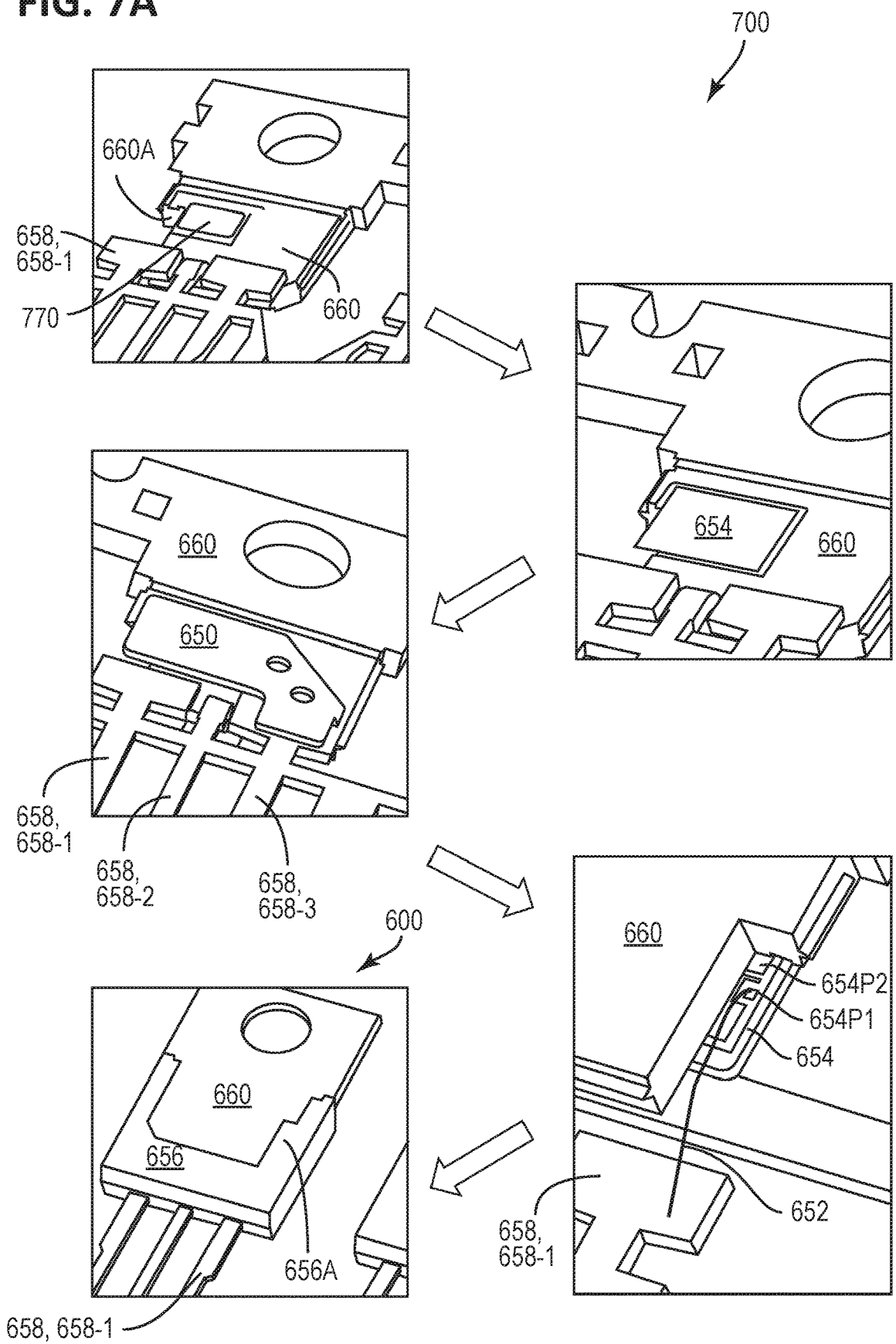
FIGS. 7A and 7B each visualize a process of forming a chip package in accordance with various embodiments.
Figure 7B:
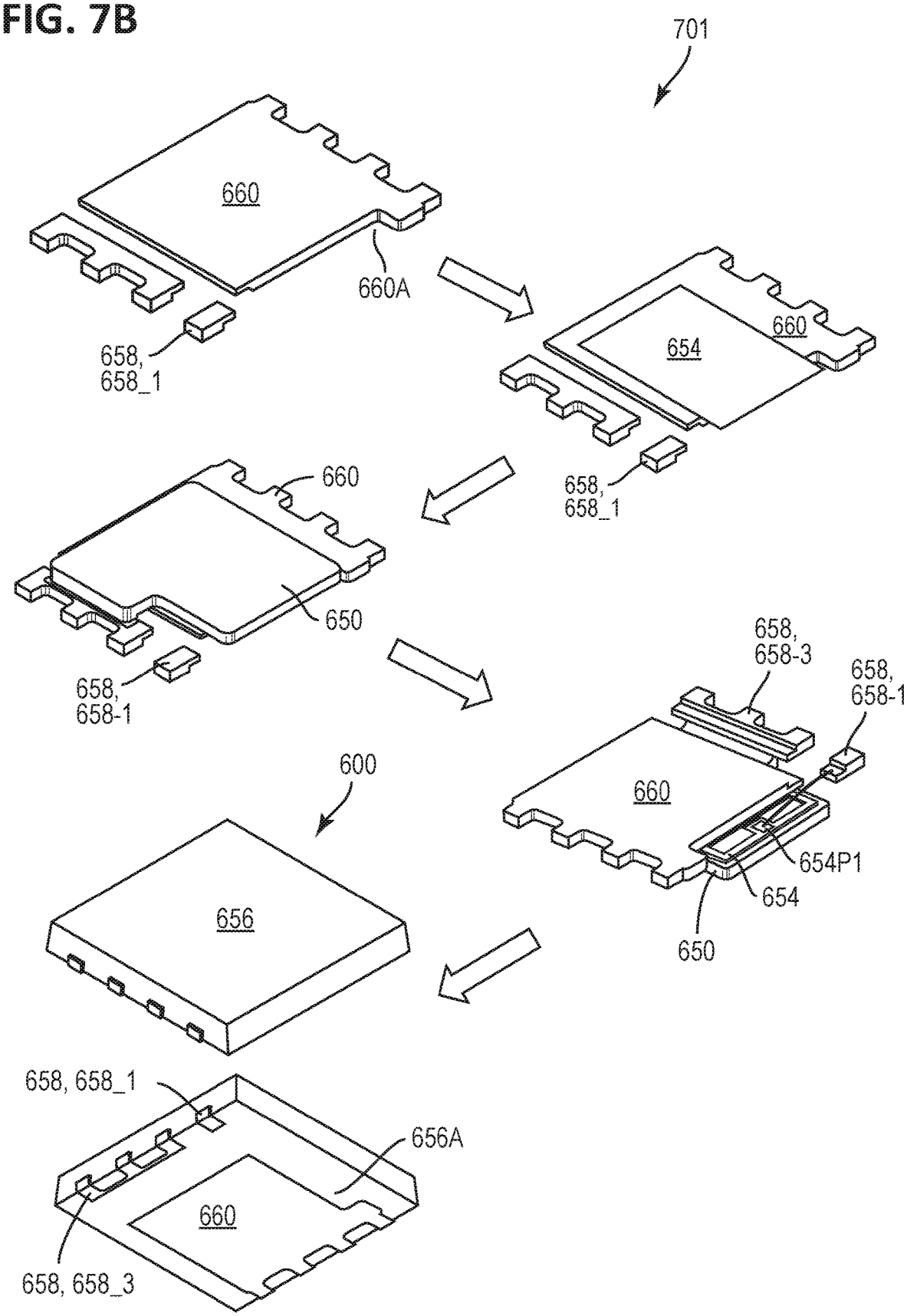

FIGS. 5 to 7A visualize the above described concept in an exemplary fashion for a TO220 package, and FIG. 7B for a TDSON-Leadless package.

The chip package 600 may include a semiconductor chip 654, for example a transistor chip 654, for example a MOSFET or an IGBT chip. The semiconductor chip 654 may include, on a front side, a first connecting pad 654P1, for example a gate pad 654P1, and a second connecting pad 654P2, for example a source pad 654P2. The semiconductor chip 654 may further include, on a back side opposite the front side, a third connecting pad 654P3, for example a drain pad 654P3.

The chip package 600 may further include a carrier 660, for example an electrically conductive carrier 660, for example a leadframe 660, e.g. a leadframe 660 including or consisting of copper or any other leadframe material as used in the art.

The carrier 660 may differ from leadframes as typically used in the art by a recess 660A that may be defined by the carrier 660. The carrier 660 may for example have a cutout in a recess area 660A where, in the prior art carrier, carrier material may be arranged. The recess 660A may allow a placement of the semiconductor chip 654 as described below.

The carrier 660 may further include a pad contact area 660P. The pad contact area 660P may be provided for being contacted by the second connecting pad 654P2, e.g. the source pad 654P2, for example by attaching the second connecting pad 654P2 to the pad contact area 660P, for example by soldering, e.g. soft soldering or diffusion soldering, glueing, sintering, or any other suitable technique used in the art.

The pad contact area 660P may in various embodiments, for example in chip packages 600 for higher voltage classes, have a predefined shape, for example by arranging a groove in the carrier 660 around the pad contact area 660P. The groove may for example be formed during a stamping process for forming the carrier 660. The groove may increase an insulation distance between an edge of the semiconductor chip 654, which may usually be on drain potential, and the pad contact area 660P (and possibly also the carrier 660 as a whole), which may be at source potential. In other words, the groove at source potential may be under the chip edge at drain potential, such that an increased distance may be beneficial in high voltage applications.

This may, however, require a dedicated design for each chip size. in a case where high versatility is preferred, for example for low-voltage applications, the groove may be omitted, and the pad contact area 660P may essentially be defined by an area that is actually contacted by the second connecting pad 654P2.

The chip package 600 may further include encapsulation material 656 encapsulating the semiconductor chip 654. The encapsulation material 656 may further at least partially include the carrier 660 and further elements of the chip package 600, for example as described below, A plurality of external connections 658 may be part of the chip package 600, which may extend out of the encapsulation material 656 or which may be free from the encapsulation material 656 for enabling to electrically conductively contact the first connecting pad 654P1, the second connecting pad 654P2, and the third connecting pad 654P3, respectively. The plurality of external connections 658 may for example include a first external connection 658_1, a second external connection 658_2, and a third external connection 658_3. The first external connection 658_1 may for example be connected to the first connecting pad 654P1, e.g. the gate pad. The second external connection 658_2 may for example be connected to the second connecting pad 654P2, e.g. the source pad. The third external connection 658_3 may for example be connected to the third connecting pad 654P3, e.g. the drain pad.

The chip package 600 may further include an electrically conductive clip 650. The electrically conductive chip may be configured to form an electrically conductive connection between the third connecting pad 654P3, e.g. the drain pad, and the third external connection 658_3, which may for example protrude from the encapsulation 656. The clip 650 may for example be attached to the third connecting pad 654P3 by soldering, e.g. soft soldering or diffusion soldering, glueing, sintering, or the like. In various embodiments, the clip 650 may itself form the third external connection 658_3. The clip 650 may for example be bent to reach a top side of the chip package 600. Thus, after encapsulation, an exposed pad at drain potential may be provided as the third external connection 658_3.

In various embodiments, the semiconductor chip 654 may be arranged with its front side facing the carrier 660, with the first connecting pad 654P1 over the recess 660A, and with the second connecting pad 654P2 contacting the pad contact area 660P. This is shown in FIG. 6A (with the clip 650 already in place) as top views in the two top panels, as bottom views in the middle and the lower panel on the left, and as top views in the top right panels of FIG. 7A and FIG. 7B, respectively.

The clip 650 may be arranged over the back side of the semiconductor chip 654 in such a way that it covers the semiconductor chip 654. The clip 650 may for example cover the semiconductor chip 654 completely, or the clip 650 may cover a substantial fraction of the semiconductor chip 654, for example at least 50%, e.g. at least 60%, e.g. at least 70%, e.g. at least 80%, e.g. at least 90%. In various embodiments, the clip 650 may be larger than the semiconductor chip 654. In that case, the clip 650 may extend over one or more, e.g. all, edges of the semiconductor chip 654. A portion of the semiconductor chip 654 that should be covered by the clip 650 is where the semiconductor chip 654 extends over the recess 660A, By this arrangement, the clip 650 may provide a support for the semiconductor chip 654 during an attachment of a contact structure 652, e.g. a wire, e.g. a lead, to the first connecting pad 654P1. This is shown in FIG. 6A as top views in the two top panels, as bottom views in the middle and the lower panel on the left, and as top views in the middle left panels of FIG. 7A and FIG. 7B, respectively.

The electrically conductive contact structure 652 may electrically conductively connect the first connecting pad 654P1 with the first external connection 658_1. The electrically conductive contact structure 652 may for example be wire bonded or soldered to the first connecting pad 654P1, or by any other suitable technique used in the art, for example any technique typically used for attaching a wire to a connecting pad, including those techniques that may require pressing on the connecting pad 654P1, because the clip 650 may provide sufficient support to avoid breaking the semiconductor chip 654 during the attachment process. This is shown in FIG. 6A as bottom views in the middle and the lower panel on the left, and as bottom views (onto the upside-down partially completed chip package 600) in the lower right panels of FIG. 7A and FIG. 7B, respectively.

Subsequently, the encapsulation material 656 may be arranged, for example during a molding process. The encapsulation material 656 may be arranged in such a way that the resulting chip package 600 has an outline that is similar or identical to prior art transistor outline packages, for example TO220, TO247, TO-Leadless, or QDPAK. This is shown in FIG. 6A in the bottom right panel, and in FIGS. 7A and 7B in the bottom left panel.

In various embodiments, for proper wire bonds, the electrically conductive contact structure 652, e.g. the gate lead 652, may be plated with e.g. nickel (Ni) or silver (Ag) on the pad, e.g. on the bottom side of pad (which may correspond to a front side of the pad in prior art chip packages). Typical wire materials may include aluminum (Al), copper (Cu), gold (Au), and silver (Ag).

In various embodiments, an arrangement of the first external connection 658_1, the second external connection 658_2, and the third external connection 658_3 may be any suitable arrangement, for example as three pins similar to a prior art package, e.g. a TO220 package, either with the same sequence of gate/drain/source as in the prior art package (e.g., G-D-S), with only the exposed pad that is exposed at the bottom side of the package having been changed to source potential. Other configurations, e.g. G-S-D for the pins, may be used in various embodiments, as long as the exposed pad, which is for example shown in FIG. 7A in the bottom left panel as the visible bottom side portion of the carrier 660, is at source potential.

In various embodiments, a placement of the semiconductor chip 654 and of the clip 650 may not be performed individually, as shown in the examples of FIGS. 7A and 7B, but rather in a common process. For this, the semiconductor chip 654 may first be attached (e.g. soldered) to the clip 650, or even a plurality of semiconductor chips 654 may first be attached to a plurality of clips 650. The plurality of clips 650 may in various embodiments be connected, in other words, they may form an integral clip frame 670. The clip 650 with the chip 654 (or, respectively, the clip frame 670 with the plurality of chips 654) may then be arranged on the carrier 660, e.g. the leadframe, in such a way that each of the semiconductor chips 654 and each of the clips 650 is arranged as described above, e.g. with the second connecting pad 654P2 contacting, e.g. being soldered to, the pad contact area 660P, and with the first connecting pad 654P1 and a portion of the clip 650 arranged over the recess 660A. This is shown in FIG. 6C. The subsequent processing may be performed as described above in context with FIG. 6A, FIG. 7A and FIG. 7B.

In various embodiments, additional connecting pads on the semiconductor chip 654 may be connected to additional external connections, e.g. by wire bonding. The additional connecting pads may be arranged over the recess 660A. For instance, additional sense pads and connections to temperature sensors may be realized.

FIG. 13 shows a flow diagram 1300 of a method of forming a chip package in accordance with various embodiments, for example of a chip package 600 as described above in context with FIG. 6A to FIG. 7B.

The process may include arranging a semiconductor chip comprising on a front side a first connecting pad and a second connecting pad with its front side facing a carrier comprising a pad contact area and a recess, wherein the first connecting pad is arranged over the recess and the second connecting pad is arranged contacting the pad contact area (in 1310).

The process may further include arranging a clip over a back side of the semiconductor chip covering the semiconductor chip where it extends over the recess (in 1320).

The process may further include electrically conductively connecting the first connecting pad with a first external connection that is free from or extends out of the encapsulation material (in 1330).

In context with FIG. 1, a typically used electrical circuit for a drive application, e.g. for an electrical forklift vehicle is described, and a requirement to dissipate heat that is generated within power MOSFETs of the circuit as efficiently as possible and drawbacks of the present solution are discussed.

In various embodiments, a power density for high power drive three phase inverters may be provided.

In various embodiments, a "standard" drain-down chip package and a source-down chip package, e.g. as described above, may be combined to build a half bridge system. For example, a drain-down transistor outline package (e.g., a TO220 package) and a source-down transistor outline package (e.g., a TO220 source-down package, e.g. as described above in context with FIG. 7A) may be combined to build the half bridge system.

Figure 8A:
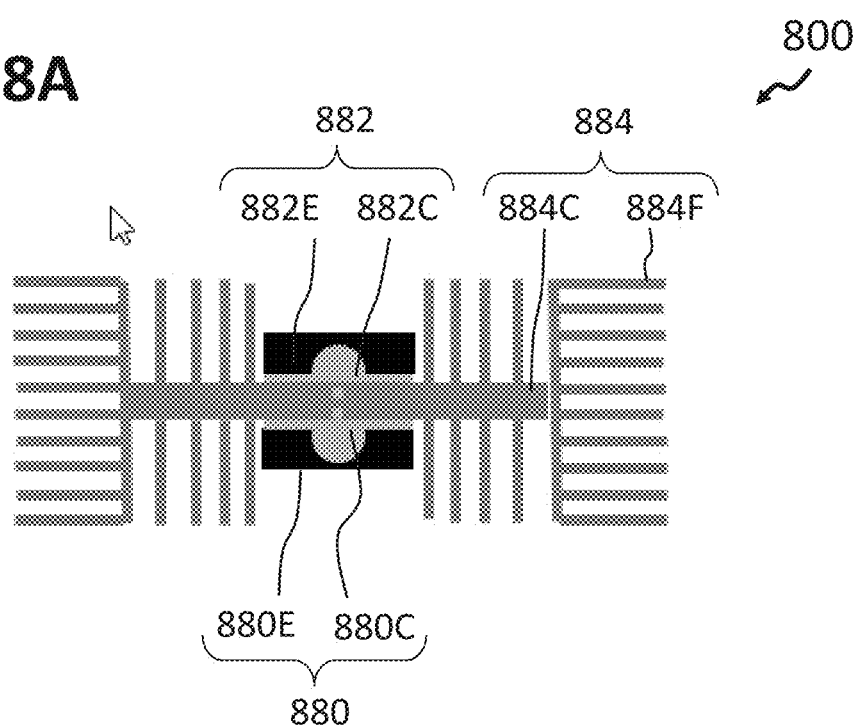
FIG. 8A and FIG. 8B each show a schematic view of a semiconductor arrangement in accordance with various embodiments.
Figure 8B:
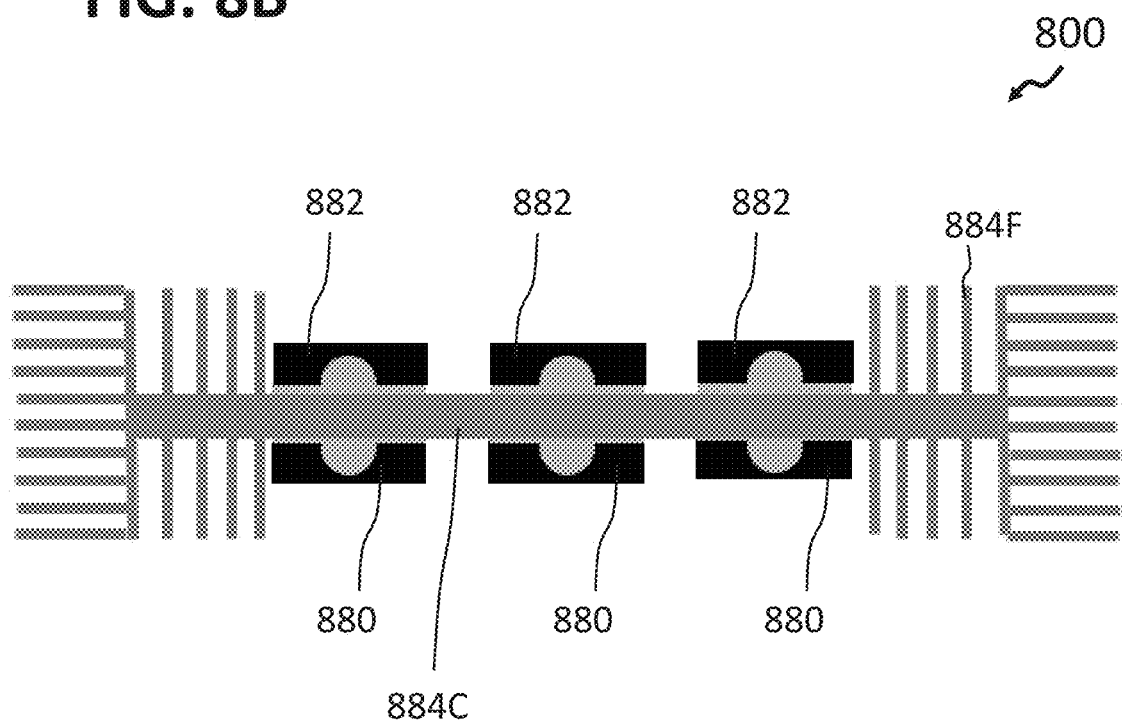
Figure 9:
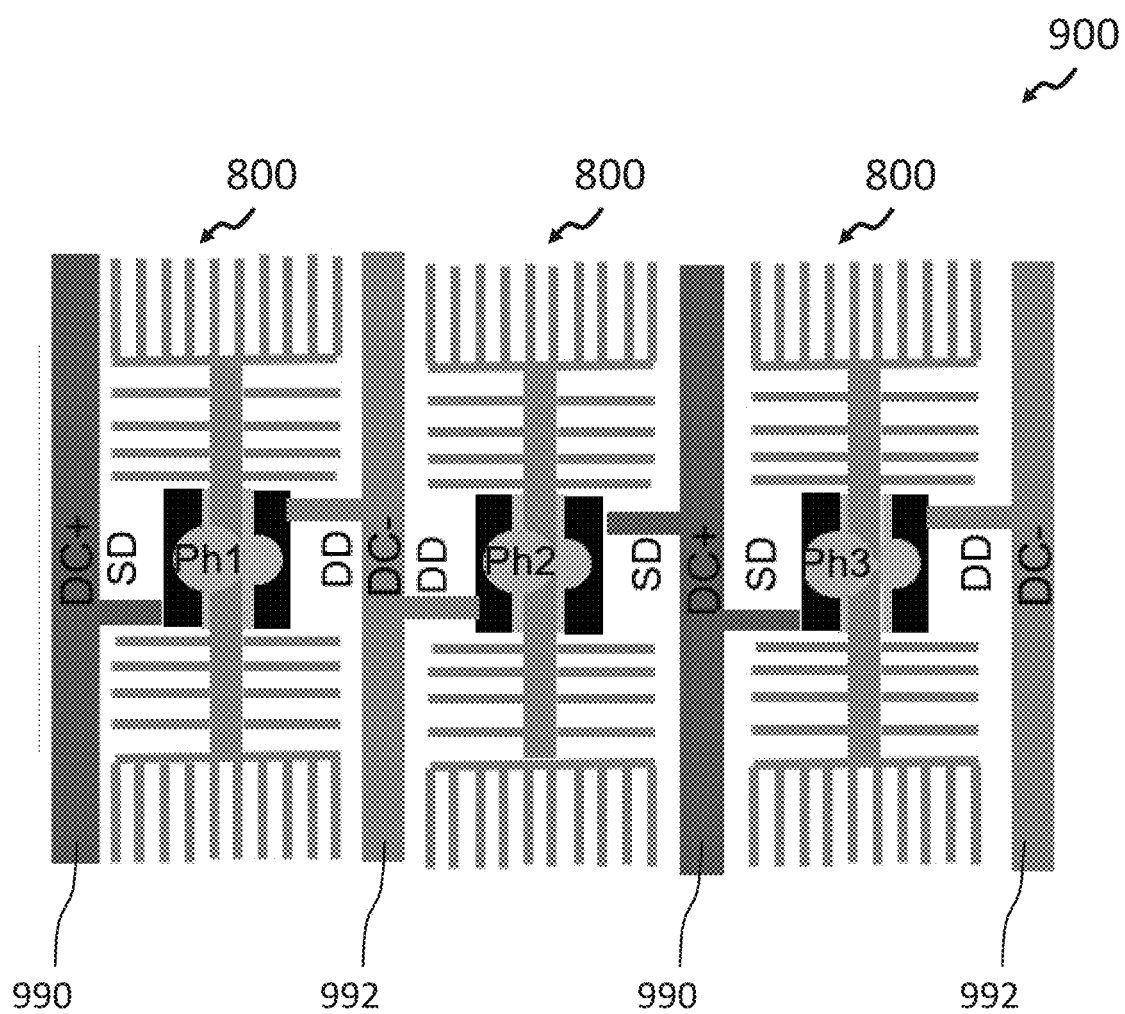
FIG. 9 shows a schematic view of a three-phase system in accordance with various embodiments.

Each of FIG. 8A and FIG. 8B shows a schematic view of a semiconductor arrangement 800, e.g. a half bridge system, in accordance with various embodiments, and FIG. 9 shows a schematic view of a three-phase system 900 in accordance with various embodiments. The three-phase system 900 may include three of the semiconductor arrangements 800.

The semiconductor arrangement 800 may in various embodiment include a first cooling element 884. The cooling element 884 may include or consist of a thermally highly conductive material, e.g. a metal, for example a metal that is typically used in the art for forming cooling elements 884.

The cooling element 884 may include a contact portion 884C, which may be configured to be contacted by at least a pair of chip packages 880/882, and a portion with an increased surface area 884F for an improved heat transfer to an ambient medium. The portion with the increased surface area 884F may for example be formed with/as fins, e.g. as shown in FIGS. 8A, 8B and 9.

The semiconductor arrangement 800 may further include at least one first chip package 880, which may also be referred to as a source-down chip package 880. The source-down chip package 880 may for example be a semiconductor chip package 600 as described above in context with FIG. 6A to 7B.

The source-down chip package 880 may include a first transistor chip, e.g. a MOSFET chip, an encapsulation 880E encapsulating the first transistor chip, and a first cooling structure 880C exposed on a first side of the first chip package 880. The first cooling structure 880C may be electrically conductively connected to a source contact of the first transistor chip.

The semiconductor arrangement 800 may further include at least one second chip package 882, which may also be referred to as a drain-down chip package 882. The drain-down chip package 882 may for example be a standard transistor outline package like, e.g., a standard power package with an exposed pad, for example TO220, TO247, TO-Leadless or QDPAK.

The drain-down chip package 882 may include a second transistor chip, an encapsulation 882E encapsulating the second transistor chip, and a second cooling structure 882C exposed on a first side of the second chip package 882. The second cooling structure 882C may be electrically conductively connected to a drain contact of the second transistor chip.

In various embodiments, at least one of the at least one first chip package 880 may be mounted on the cooling element 884 with the first cooling structure 880C contacting the first cooling element 884, e.g. the contact portion 884C of the first cooling element 884, on a first side. Furthermore, at least one of the at least one second chip package 882 may be mounted on the cooling element 884 with the second cooling structure 882C contacting the first cooling element 884, e.g. the contact portion 884C of the first cooling element 884, on a second side opposite the first side.

The source contact of the source-down chip package 880 and the drain contact of the drain-down chip package 882 may in various embodiments be electrically conductively connected by the cooling element 884. Due to the direct connection of the chip packages 880, 882, respectively, to the cooling element (also referred to as heat sink) 884, the thermal performance may be significantly improved, since a thermal (and/or electrical) isolation foil, which may be omitted in various embodiments, may typically not be a good thermal conductor (a thermal conductivity may be in the range of 2 W/mK).

The semiconductor arrangement 800 may be configured as a half bridge system. The exemplary embodiments shown in FIG. 8A and FIG. 8B may form such half-bridge systems, which may be built using a TO220 source-down chip package 880 and a TO220 drain-down chip package 882. A carrier including an electronic circuit may in various embodiments be provided for forming the half-bridge system. The first cooling element 884 may be mounted on the carrier.

In various embodiments, for example if more output power or current is required, two or more chip packages may be easily connected in parallel. An exemplary embodiment having three parallel chip packages 880 of the at least one first chip package 880 and three parallel chip packages 882 of the at least one second chip package 882 is shown in FIG. 8B. The contact portion 884C of the first cooling element 884 may be larger to accommodate the three parallel first chip packages 880 on the first side and the three parallel second chip packages 882 on the second side. Each of the three parallel first chip packages 880 may be mounted on the first side in an identical manner, e.g. as described above, and each of the three parallel second chip packages 882 may be mounted on the second side in an identical manner, e.g. as described above.

In various embodiments, the semiconductor arrangement 800 may be combined with two similar or identical semiconductor arrangements 800. Together, the three semiconductor arrangements 800 may form a three-phase system 900, for example a three-phase system 900, e.g. an inverter 900, as shown in FIG. 9. High side power lines 990 and low side power lines 992 may in various embodiments be part of a circuit, which may for example be part of a carrier (not shown). In various embodiments, an expensive insulated metal substrate (IMS) printed circuit board (PCB) is not required, since no cooling through the main board is required. Instead, a standard cheap FR4 PCB (without thermal vias) may be used.

A phase may in various embodiments be directly connected by a cable to one or both of the chip packages 880, 882, respectively. In various embodiments, the phase may be connected by a cable to the cooling element 884, to which the chip packages 880, 882 may be electrically and thermally connected.

In various embodiments, the chip packages 880, 882 may be electrically insulated from the cooling element 884, and low and high side phase nodes of the half-bridge system may be connected by a different connection mechanism, for example by a mechanical screw that may be used for connecting the phase with a device to be driven, e.g. an electrical motor.

In various embodiments, an effective electrical package resistance of the chip package (e.g., the TO220 package) 880 may be significantly reduced, since only one package lead is required for the power current flow Furthermore, a thermal performance may in various embodiments be improved by directly connecting the semiconductor packages 880, 882 to the heat sink 884.

In various embodiments, physical dimensions of the three-phase system 900, e.g. the inverter 900, may differ from those of current surface mount device (SMD) based system solutions. While current systems are mainly extending in an essentially planar x-y-direction, whereas the solution from picture 5 also uses a z-dimension, which may result in lower space requirement in the x-y plane, and thus a smaller required PCB areas, which may lower a system cost (which may be proportional to the PCB cost).

Figure 10A:
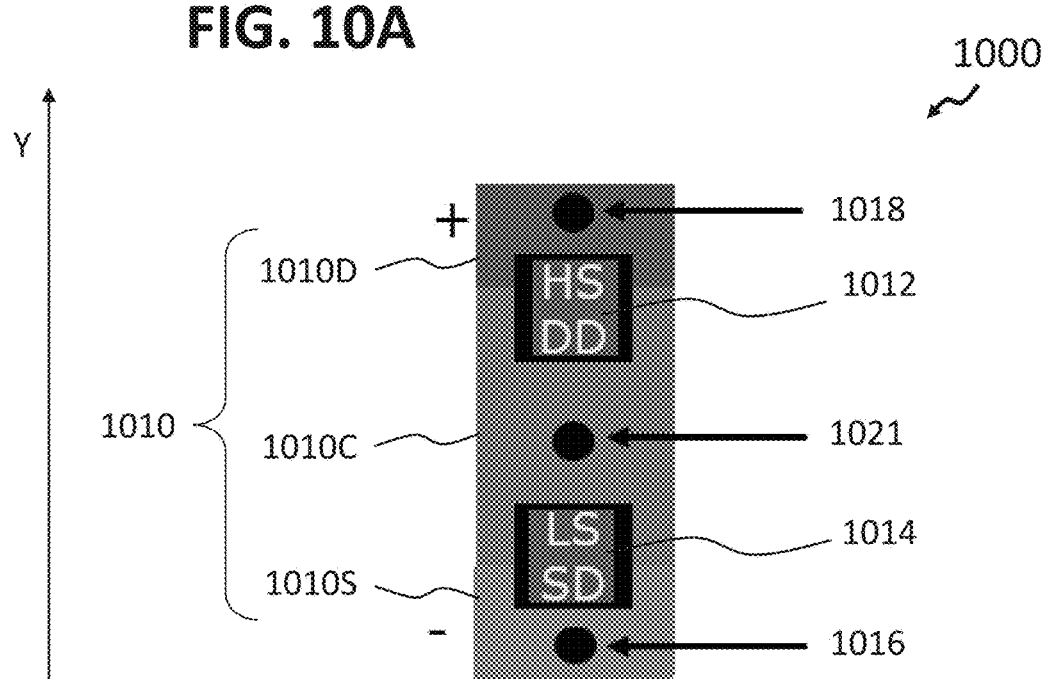
FIG. 10A and FIG. 10B each show a schematic view of a half-bridge module in accordance with various embodiment.
Figure 10B:
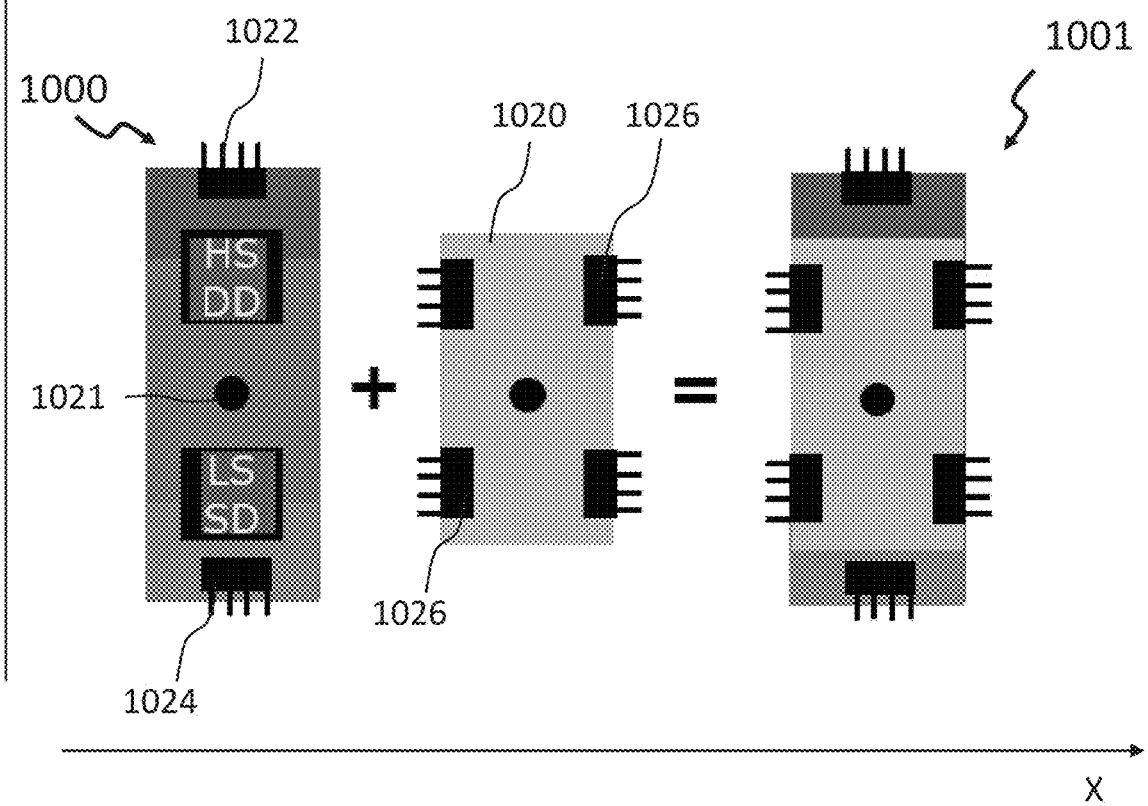
Figure 11A:
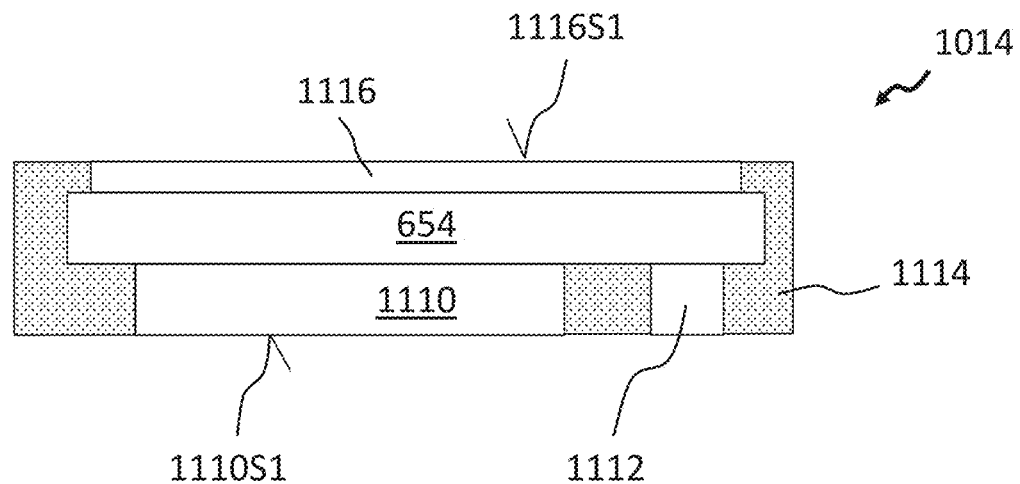
FIG. 11A shows a schematic cross-sectional view of a transistor package with a source-down configuration as used in a half-bridge module in accordance with various embodiments.
Figure 11B:
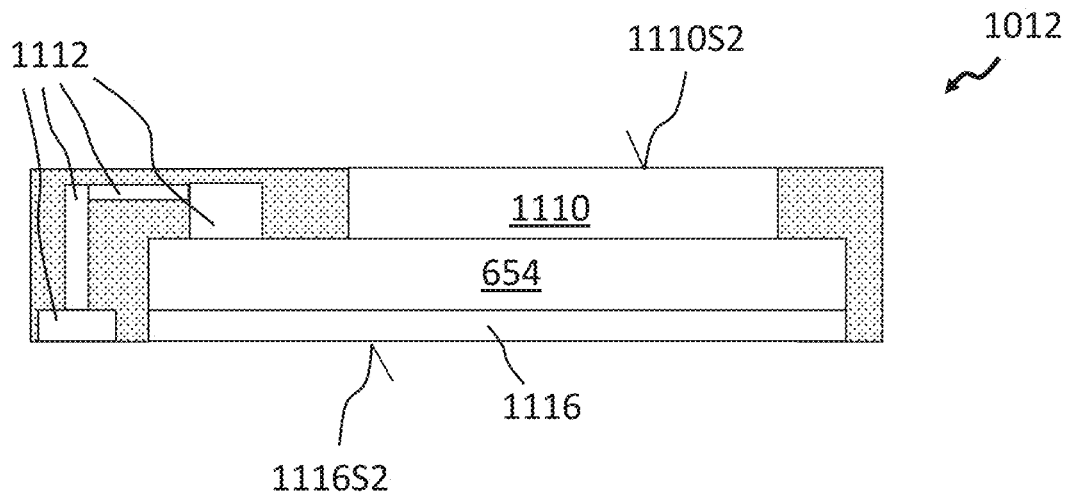
FIG. 11B shows a schematic cross-sectional view of a transistor package with a drain-down configuration as used in a half-bridge module in accordance with various embodiments.
Figure 12A:
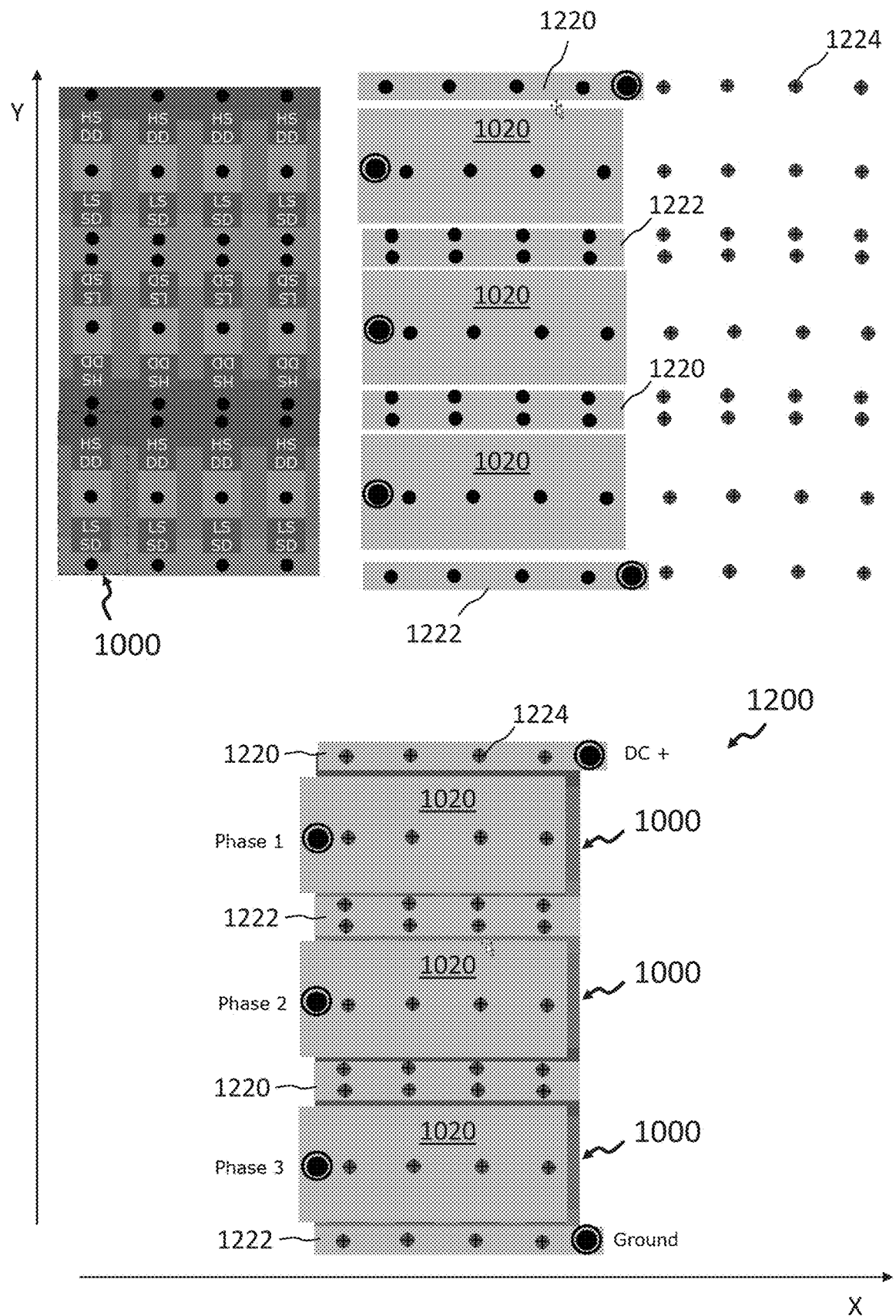
FIG. 12A shows a schematic illustration of a three-phase system in accordance with various embodiments and of elements from which it is formed.
Figure 12B:
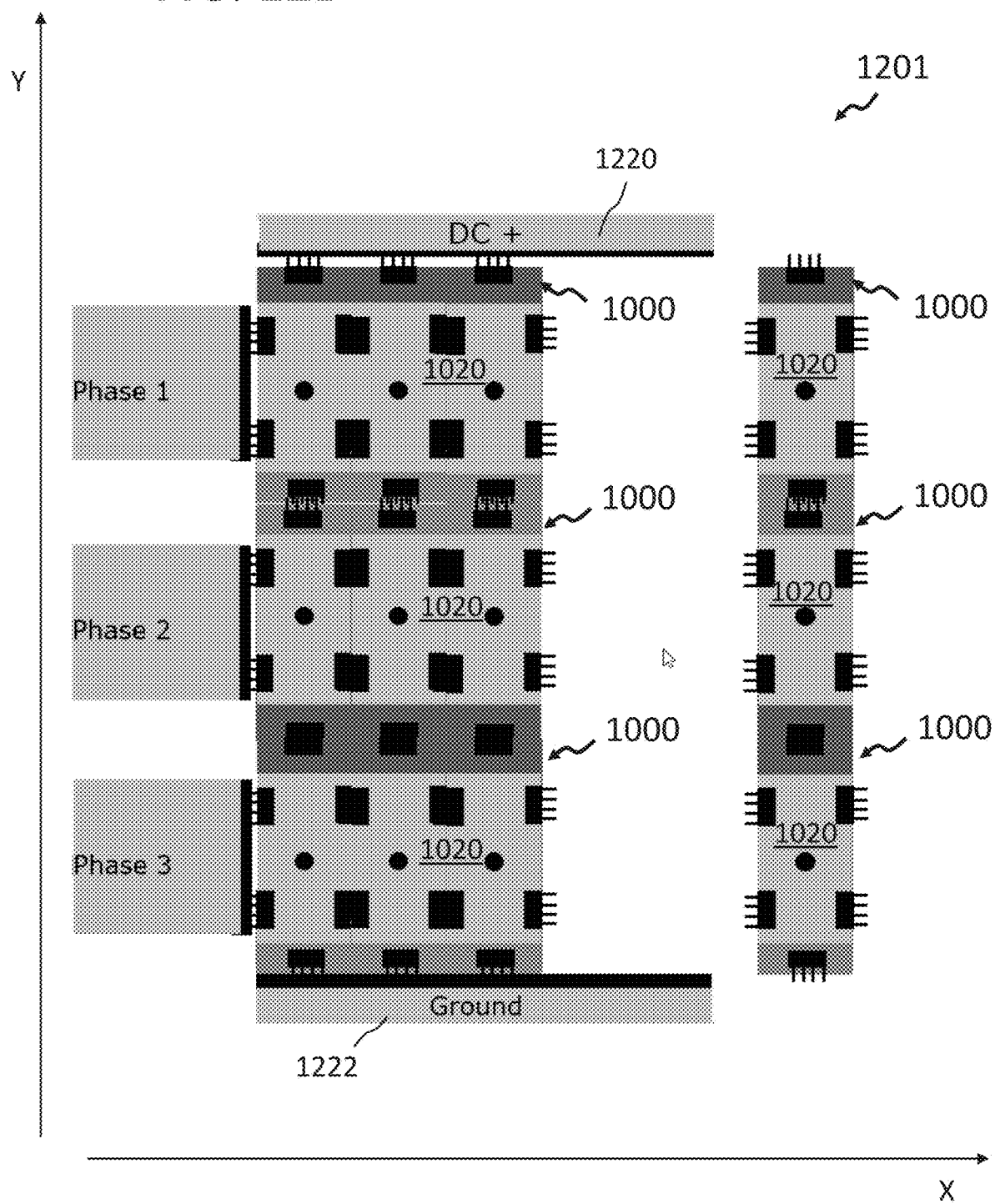
FIG. 12B shows a schematic illustration of a three-phase system accordance with various embodiments.

FIG. 10A shows a schematic top view of a half-bridge module 1000 in accordance with various embodiments, and FIG. 10B shows a schematic top view of a half-bridge module 1001 in accordance with various embodiments. FIG. 11A shows a schematic cross-sectional view of a transistor package 1014 with a source-down configuration as used in a half-bridge module 1000, 1001 in accordance with various embodiments, FIG. 11B shows a schematic cross-sectional view of a transistor package 1012 with a drain-down configuration as used in a half-bridge module 1000, 1001 in accordance with various embodiments, FIG. 12A shows a schematic illustration of a three-phase system 1200 in accordance with various embodiments and of elements from which it is formed, and FIG. 12B shows a schematic illustration of another three-phase system 1200 in accordance with various embodiments. To avoid crowding, some structures that may be identified in several of the figures have not been provided with reference numbers. If necessary, they can be looked up in corresponding labelled figures.

A half-bridge module 1000, 1001 may in various embodiments include a carrier 1010 having a top side (from which the half-bridge modules 1000, 1001 are shown in FIGS. 10A, 10B and 12A), a first source pad 10105, and a first drain pad 1010D. The first source pad 1010S and the first drain pad 1010D may be connected by a central portion 1010C of the carrier 1010. The central portion 1010C may be electrically insulating. The first source pad 1010S and the first drain pad 1010D may be electrically conductive. They may for example include or consist of a metal, e.g. a surface metallization or an included or attached metal portion, e.g. a metal block. The carrier 1010 may for example be a small PCB based on FR4 or IMS.

The half-bridge module 1000, 1001 may further include a first transistor package 1014 including a first source contact surface 1110S1 (see FIG. 11A) exposed at a bottom side of the first transistor package 1014, and a first drain contact surface 1116S1 exposed at a top side of the first transistor package 1014. The first transistor package 1014 may for example include a power MOSFET. The transistor package 1014 shown in FIG. 11A is meant to only schematically visualize a few properties of the first transistor package included in the half-bridge module 1000, 1001, for example that the first source contact surface 1110S1 is exposed at a bottom side of the transistor package 1014, that a gate contact 1112 is also exposed at the bottom side of the transistor package 1014, and that the first drain contact surface 1116S1 is exposed at the opposite top side of the transistor package 1014. An arrangement of a transistor chip 654, electrically conductive structures 1110, 1116, 1112 and an electrically insulating material 1114 may have any suitable configuration that provides the described properties.

The first transistor package 1014 may in various embodiments for example be a source-down transistor package 600 as described above in context with FIG. 6A to FIG. 7B for the embodiment having the clip 660 exposed at the top of the chip package 600, for example a S308 source-down package with the drain contact exposed at the top. In various embodiments, the first transistor package 1014 may be provided by a chip embedding technology.

The first transistor package 1014 may be mounted to the top side of the carrier 1010 with the first source contact surface 1110S1 electrically and mechanically contacting the first source pad 1010S. The first transistor package 1014 may for example be soldered or glued with its first source contact surface 1110S1 to the first source pad 1010S, or attached by other suitable techniques known in the art.

The half-bridge module 1000, 1001 may further include a second transistor package 1012 including a second source contact surface 1110S2 (see FIG. 11B) exposed at a top side of the second transistor package 1012, and a second drain contact surface 1116S2 exposed at a bottom side of the second transistor package 1012. The second transistor package 1012 may for example include a power MOSFET. The transistor package 1012 shown in FIG. 11B is meant to only schematically visualiza a few properties of the second transistor package included in the half-bridge module 1000, 1001, for example that the second drain contact surface 1116S2 is exposed at a bottom side of the transistor package 10124, that a gate contact 1112 is also exposed at the bottom side of the transistor package 1012, and that the second source contact surface 1110S2 is exposed at the opposite top side of the transistor package 1012. An arrangement of a transistor chip 654, electrically conductive structures 1110, 1116, 1112 and an electrically insulating material 1114 may have any suitable configuration that provides the described properties.

The second transistor package 1012 may in various embodiments for example be a drain-down transistor package with the source and the drain contact surfaces 1110S2, 1116S2 exposed at opposite main surfaces, for example a PQFN or an S308 package with the source electrode exposed at the top. In various embodiments, the second transistor package 1012 may be provided by a chip embedding technology.

The second transistor package 1012 may be mounted to the top side of the carrier 1010 with the second drain contact surface 1116S2 electrically and mechanically contacting the first drain pad 1010D. The second transistor package 1012 may for example be soldered or glued with its second drain contact surface 1116S2 to the first drain pad 1010D, or attached by other suitable techniques known in the art.

In various embodiments, a portion of the first source pad 1010S may be exposed at the top side at a first end of the carrier 1010, and a portion of the first drain pad 10110D may be exposed at the top side at a second end of the carrier 1010. The second end of the carrier 1010 may be opposite the first end. They may for example be at opposite ends of the carrier 1010 along a long axis of the carrier 1010.

For ease of description of embodiments of arrangements of the half-bridge modules 1000, 1001 with respect to each other, X and Y directions are indicated in FIGS. 10A, 10B, 12A, and 12B. The Y direction may coincide with a line connecting the first transistor package 1014 and the second transistor package 1012. The X direction may be orthogonal to the Y direction in a plane of the carrier 1010.

The half-bridge module 1000, 1001 may further include at least one fixing structure 1016, 1018, 1022, 1024 at the first source pad 1010S (fixing structure 1016 or 1024) and/or at the first drain pad 1010D (fixing structure 1018 or 1022). The at least one fixing structure 1016, 1018, 1022, 1024 may be configured to provide or enable a mechanical fixation and an electrically conductive coupling between the first source pad 1010S and a further first source pad 1010S of an adjacent further half-bridge module 1000, 1001, and/or a mechanical fixation and an electrically conductive coupling between the first drain pad 1010D and a further first drain pad 1010D of the adjacent further half-bridge module 1000, 1001.

The at least one fixing structure 1016, 1018, 1022, 1024 may in various embodiments be at least one screw hole 1016, 1018 formed in the first source pad (the screw hole 1016) and/or in the first drain pad (the screw hole 1018). Examples of this are shown in FIG. 10A and in FIG. 12A.

The at least one fixing structure 1016, 1018, 1022, 1024 may in various embodiments be at least one locking element 1022 attached to or formed in the first source pad 1010S and configured to couple to a corresponding further locking element 1022 of the further half-bridge module 1001, and/or at least one locking element 1024 attached to the first drain pad 1010D and configured to couple to a corresponding further locking element 1024 of the further half-bridge module 1001. Examples of this are shown in FIG. 10B and in FIG. 12B. Even though the locking elements 1022 and 1024 are only shown to extend from the first source pad 1010S and from the first drain pad 1010D in a direction along a long axis of the carrier 1010, they may alternatively or additionally be provided extending from edges connecting the first drain pad 1010D with the first source pad 1010S, e.g. protruding along a direction of a short axis of the carrier 1010. The locking elements 1024 may allow a coupling of adjacent first source pads 1010S.

The locking element 1022, 1024 may for example have a comb-like structure, or a jigsaw-puzzle type structure, or any other suitable structure that may allow to establish a stable mechanical connection between adjacent half-bridge modules 1001 and to provide an electrically conductive connection between adjacent first source pads 1010S (the locking elements 1024) and/or between adjacent drain pads 1010D (the locking elements 1022).

Even though the locking elements 1022, 1024 in accordance with various embodiments shown in FIG. 10B and FIG. 12B have identical structures, the locking elements 1022 may in various embodiments differ from the locking elements 1024, for example in such a way that they are incompatible. Thereby, an inadvertent coupling of a first source pad 1010S of a half-bridge module 1001 to a first drain pad 1010D of a further half-bridge module 1001 may be prevented.

In other words, two (e.g., identical or essentially identical) half-bridge modules 1000 or two (e.g., identical or essentially identical) half-bridge modules 1001 may be placed adjacent to each other with their top sides facing the same direction. Examples of such arrangements are shown in FIG. 12A and FIG. 12B, respectively.

In various embodiments, two (or more) half-bridge modules 1000 or two (or more) half-bridge modules 1001 may be placed adjacent to each other in the X direction. In that case, the half-bridge modules 1000 or the half-bridge modules 1001 may be arranged with the same orientation. Examples are shown in FIG. 12A for the half-bridge module 1000, and in FIG. 12B for the half-bridge module 1001.

In that case, the respective first source pads 1010S may be adjacent to each other, forming an area or a line of first source pads 1010S. The respective first drain pads 1010D may be adjacent to each other, forming an area or a line of first drain pads 1010D. And the central portions 10100 may be adjacent to each other, forming an area or a line of central portions 1010C. The half-bridge modules 1000, 1001 may be arranged in direct contact with each other or (at least for the half-bridge modules 1000) with a (for example small) gap between them. Adjacent arrangement in the X direction may allow connecting plurality of half-bridge modules 1000 or 1001, respectively, in parallel, in other words, for the same phase, for increasing an available voltage or current for high-power applications.

In various embodiments, three or more half-bridge modules 1000 or three or more half-bridge modules 1001 may be arranged adjacent to each other in the Y direction.

In that case, the half-bridge modules 1000 or 1001, respectively, may be arranged in such a way that their long axes align and that the first source pads 1010S of two adjacent half-bridge modules 1000 or 1001, respectively, are adjacent to each other. In that case, the respective first source pads 1010S may form an area (and optionally, together with further half-bridge modules 1000 or 1001 arranged adjacent in the X direction, a line) of first source pads 1010S.

Furthermore, the half-bridge modules 1000 or 1001, respectively, may be arranged in such a way that their long axes align and that the first drain pads 1010D of two adjacent half-bridge modules 1000 or 1001, respectively, are adjacent to each other. In that case, the respective first drain pads 1010D may form an area (and optionally, together with further half-bridge modules 1000 or 1001 arranged adjacent in the X direction, a line) of first drain pads 1010D.

This configuration may allow to easily provide three phases of a three-phase system 1200, 1201. More phases may be added by adding further half-bridge modules 1000 or, respectively, 1001, in the Y direction.

Adding more half-bridge modules 1000 or 1001, respectively, in the X direction may allow to provide a three (or more) phase system with increased power. See FIG. 12A for an exemplary configuration of a three-phase system 1200, e.g. an inverter, based on the half-bridge module 1000. The half-bridge modules 1000 are arranged in a matrix-like configuration. See FIG. 12B for an exemplary configuration of a three-phase system 1201, e.g. an inverter, based on the half-bridge module 1001. The half-bridge modules 1001 are arranged in a matrix-like configuration. Due to their modular combinability, the half-bridge modules 1000 and 1001 may also be referred to as "power bricks".

In various embodiments, the first drain contact surface 1116S1 exposed at a top side of the first transistor package 1014 and the second source contact surface 1110S2 exposed at a top side of the second transistor package 1012 may be arranged at the same distance from a top side surface of the carrier 1010. This may allow the first drain contact surface 1116S1 and the second source contact surface 1110S2 to be easily connected by a common conductor element 1020, e.g.

by a common conductor element 1020 that has a simple structure, for example flat metal element.

In various embodiments, the common conductor element 1020 may be arranged to extend in the X direction (e.g., in a direction of a short axis of the carrier 1010) over an edge of the carrier 1010. For example, the common conductor element 1020 may have a length that corresponds approximately to a multiple (e.g. n times) of a width of the carrier 1010 along its short axis (e.g., in X direction). This may allow to couple a plurality (e.g. n) half-bridge modules 1000, e.g. their respective first drain contact surfaces 1116S1 and their respective second source contact surfaces 1110S2, with each other using the common conductor element 1020. For example, a bus bar may be used as the common conductor element 1020, or any other electrically conductive element that is suitable for high power applications and has sufficient mechanical stability for joining the half-bridge modules 1000.

The common conductor element 1020 may in various embodiments be fixed directly to the first drain contact surface(s) 1116S1 and to the second source contact surface(s) 1110S2, for example by soldering, glueing, or any other suitable technique for forming an electrically conductive contact that fixes the common conductor element 1020 to the first drain contact surface(s) 1116S1 and to the second source contact surface(s) 1110S2.

In various embodiments, the carrier 1010 may further include an insulated through hole 1021 for fixing the common conductor element 1020 to the half-bridge module 1000, 1001. By fixing the common conductor element 1020 (which may be provided with a corresponding through hole) to the carrier 1010, the common conductor element 1020 may be brought into electrically conductive contact with the first drain contact surface(s) 1116S1 and the second source contact surface(s) 1110S2 An example of this is shown in FIG. 12A.

In various embodiments, the half-bridge module 1000, 1001 may realize a pure vertical current flow, and therefore no current redistribution within the package 1000, 1001 may be required. This may significantly reduce a package resistance, for example down to a single digit µΩ range.

Furthermore the common conductor element 1020, which may form a top side phase bus, may improve a thermal performance regarding $R_{th}$ and $Z_{th}$. In other words, since the power MOSFETs are cooled from a top side and from a bottom side, the thermal performance is improved.

In various embodiments, the common conductor element 1020 may have two functions: on the one hand, to districute the current, and on the other hand, to act as a top side heat sink.

In various embodiments, due to a lower power loss generation (due to the lower package resistance) and the better cooling (due to the double sided cooling), a power density of the half-bridge module 1000, 1001 (and, consequently, also of the three-phase systems 1200, 1201) may be significantly increased.

In various embodiments, in a three-phase system 1200, for example as shown in FIG. 12A, a plurality of half-bridge modules (here: 12) 1000 may be combined. Three common conductor elements 1020 may be provided, one for each of the three phases. The first of the common conductor elements 1020 may be arranged for coupling the first drain contact surface(s) 1116S1 and the second source contact surface(s) 1110S2 of a first subset (in this case, four) of the plurality of half-bridge modules 1000 to provide the first phase. The second of the common conductor elements 1020 may be arranged for coupling the first drain contact surface(s) 1116S1 and the second source contact surface(s) 1110S2 of a second subset (in this case, four) of the plurality of half-bridge modules 1000 to provide the second phase. The third of the common conductor elements 1020 may be arranged for coupling the first drain contact surface(s) 1116S1 and the second source contact surface(s) 1110S2 of a third subset (in this case, four) of the plurality of half-bridge modules 1000 to provide the third phase.

Further contact bars 1220 may be provided for coupling the first drain pads 1010D of adjacent half-bridge modules 1000 (in X direction and/or in Y direction) with each other. Further contact bars 1222 may be provided for coupling the first source pads 1010S of adjacent half-bridge modules 1000 (in X direction and/or in Y direction) with each other. The further contact bars 1220, 1222 may further be used for providing power to the three-phase system 1200.

In the embodiment of FIG. 12B, a different approach of combining the half-bridge modules 1001 to form a three-phase system 1201 is shown.

The common conductor element 1020, which may be part of or attached to each of the half-bridge modules 1001, may have a width that corresponds approximately to the width of the carrier 1010 along its short axis, e.g. in X direction. In other words, the common conductor element 1020, which may otherwise be similar to the conductor element 1020 described in context with FIG. 12A, may not extend an edge of the carrier 1010. At least one conductor locking element 1026 may be attached to or formed as part of the common conductor element 1020. The at least one conductor locking element 1026 may be configured to couple to a corresponding further conductor locking element 1026 of a further adjacent half-bridge module 1001 (or more precisely, of the common conductor element 1020). In various embodiments, at least two conductor locking elements 1026 extending over both edges of the carrier 1010 that connect the first end and the second end of the carrier 1010 may be provided. In the exemplary embodiments shown in FIG. 10B and FIG. 12B, four conductor locking elements 1026 are provided per common conductor element 1020.

The at least one conductor locking element 1026 may in various embodiments extend over at least one edge of the carrier 1010 that connects the first end and the second end, for example with a comb-like structure as shown in FIG. 10B and FIG. 12B, or for example by a jigsaw-puzzle type structure attached to or formed in the common conductor element 1020, or by any other type of locking element 1026 that may be suitable for mechanically coupling adjacent common conductor elements 1020 with each other and for providing an electrically conductive connection bewteen the adjacent common conductor elements 1020.

In various embodiments, the half-bridge modules 1001 may be combined to form the three-phase system 1201, a functionality of which, e.g. regarding a number of phases and/or power that may be provided, may be similar to what is described above in context with the three-phase system 1200. For example, the plurality of half-bridge modules 1001 arranged and coupled in Y direction may define a number of phases that may be provided. The number of half-bridge modules 1001 arranged (and coupled) in parallel along the X direction may define the maximum current/voltage that may be provided by the three-phase system 1201 (or, more generally, a multi-phase system in case of more than three phases).

Similar to the three-phase system 1200, further contact bars 1220, 1222. may be provided for supplying the three-phase system 1201 with power. The further contact bars 1220, 1222 may be attached using the locking element 1024 and 1026, respectively. Corresponding locking elements may be provided on the contact bars 1220, 1222.

In various embodiments, the three-phase systems 1200, 1201 may allow for an easy repair in a case of one of the half-bridge modules 1000 or 1001, respectively, failing. In particular in the case of the half-bridge modules 1000 being attached to the common conductor elements 1220 and to the contact bars 1220, 1222 by screws 1224, or in the case of the half-bridge modules 1001 being attached to the common conductor elements 1220 and to the contact bars 1220, 1222 by the locking elements 1226, individual half-bridge modules 1000 or 1001, respectively, may be easily detached and replaced.

Various examples will be illustrated in the following:

Example 1 is a semiconductor device. The semiconductor device may include a carrier including an electronic circuit, a plurality of semiconductor chip packages mounted on the carrier, wherein each of the chip packages includes an encapsulation encapsulating the semiconductor chip, a plurality of contact structures electrically connecting the semiconductor chip with the electronic circuit, and at least one cooling structure protruding from the encapsulation, and a cooling element thermally conductively connected to at least one cooling structure of each of at least two of the plurality of semiconductor chip packages.

In Example 2, the subject-matter of Example 1 may optionally further include that each of the plurality of semiconductor chip packages is a surface mount device surface-mounted to the carrier.

In Example 3, the subject-matter of Example 1 or 2 may further include that the carrier is a printed circuit board.

In Example 4, the subject-matter of any of the preceding Examples may further include that the cooling element is electrically conductive.

In Example 5, the subject-matter of any of the preceding Examples may further include that each of the cooling structures is electrically coupled with the semiconductor chip and with the electronic circuit, thereby forming a further contact structure In Example 6, the subject-matter of any of the preceding Examples may further include that the plurality of cooling structures are electrically coupled with each other through the cooling element.

In Example 7, the subject-matter of any of the preceding Examples may further include that each of the plurality of contact structures includes at least one controlling contact structure and at least one controlled contact structure.

In Example 8, the subject-matter of Example 7 may further include that the cooling structure is a further controlled contact structure.

In Example 9, the subject-matter of any of the preceding Examples may further include that at least one of the plurality of semiconductor chip packages is a power semiconductor device.

In Example 10, the subject-matter of any of the preceding Examples may further include that at least one of the plurality of semiconductor chip packages is a MOSFET, an IGBT, or a diode.

In Example 11, the subject-matter of any of the preceding Examples may further include that a first group of the plurality of semiconductor chip packages is arranged in a first row.

In Example 12, the subject-matter of Example 11 may further include that all of the semiconductor chip packages of the first group are arranged with the same first orientation.

In Example 13, the subject-matter of Example 11 or 12 may further include that the cooling element includes a first cooling element portion thermally coupled to the cooling structures of the semiconductor chip packages of the first group.

In Example 14, the subject-matter of any of Examples 11 to 13 may further include that a second group of the plurality of semiconductor chip packages is arranged in a second row.

In Example 15, the subject-matter of Example 14 may further include that all of the semiconductor chip packages of the second group are arranged with the same second orientation, which is different from the first orientation.

In Example 16, the subject-matter of Example 14 or 15 may further include that the cooling element includes a second cooling element portion thermally coupled to the cooling structures of the semiconductor chip packages of the second group.

In Example 17, the subject-matter of Example 16 may further include that the first cooling element portion and the second cooling element portion are integrally formed.

In Example 18, the subject-matter of any of the preceding Examples may further include that the cooling element includes aluminum, copper, an aluminum alloy and/or a copper alloy.

In Example 19, the subject-matter of any of the preceding Examples may further include that the cooling element includes an electrically conductive coil.

In Example 20, the subject-matter of any of the preceding Examples may further include that at least one of the encapsulations includes a mold material or a laminate.

In Example 21, the subject-matter of any of the preceding Examples may further include that the cooling element is in direct contact with at least one of the encapsulations.

In Example 22, the subject-matter of any of the preceding Examples may further include that the cooling elements soldered to the at least one cooling structure of each of the at least two of the plurality of semiconductor chip packages.

In Example 23, the subject-matter of any of the preceding Examples may further include that the cooling structures includes an opening for screwing the cooling element onto the cooling structures.

In Example 24, the subject-matter of any of the preceding Examples may further include that the cooling element is screwed onto the at least one cooling structure of each of the at least two of the plurality of semiconductor chip packages.

In Example 25, the subject-matter of any of the preceding Examples may further include that the electronic circuit and the plurality of semiconductor chip packages are connected to include parallel half-bridges.

In Example 26, the subject-matter of any of the preceding Examples may further include that the electronic circuit and the plurality of semiconductor chip packages are connected to include a full-bridge.

Example 27 is a three-phase system including or consisting of the semiconductor device of any of the preceding Examples.

Example 28 is a semiconductor arrangement. The semiconductor arrangement may include a cooling element, a plurality of semiconductor chip packages mounted on the cooling element, wherein each of the chip packages includes an encapsulation encapsulating the semiconductor chip, a plurality of contact structures for electrically contacting the semiconductor chip, and at least one cooling structure protruding from the encapsulation, wherein the cooling element is thermally conductively connected to at least one cooling structure of each of at least two of the plurality of semiconductor chip packages, and wherein the at least one cooling structure of each of at least two of the plurality of semiconductor chip packages are electrically connected through the cooling element.

In Example 29, the subject-matter of Example 28 may further include that each of the plurality of semiconductor chip packages is a surface mount device configured to be surface-mounted to a carrier.

In Example 30, the subject-matter of Example 28 or 29 may further include that each of the plurality of contact structures includes at least one controlling contact structure and at least one controlled contact structure.

In Example 31, the subject-matter of any of Examples 28 to 30 may further include that the cooling structure is a further controlled contact structure.

In Example 32, the subject-matter of any of Examples 28 to 31 may further include that at least one of the plurality of semiconductor chip packages is a power semiconductor device.

In Example 33, the subject-matter of any of Examples 28 to 32 may further include that at least one of the plurality of semiconductor chip packages is a MOSFET, an IGBT, or a diode.

In Example 34, the subject-matter of any of Examples 28 to 33 may further include that a first group of the plurality of semiconductor chip packages is arranged in a first row.

In Example 35, the subject-matter of Example 34 may further include that all of the semiconductor chip packages of the first group are arranged with the same first orientation.

In Example 36, the subject-matter of Example 34 or 36 may further include that the cooling element includes a first cooling element portion thermally coupled to the cooling structures of the semiconductor chip packages of the first group.

In Example 37, the subject-matter of any of Examples 34 to 36 may further include that a second group of the plurality of semiconductor chip packages is arranged in a second row.

In Example 38, the subject-matter of Example 37 may further include that all of the semiconductor chip packages of the second group are arranged with the same second orientation, which is different from the first orientation.

In Example 39, the subject-matter of any of Examples 34 to 37 may further include that the cooling element includes a second cooling element portion thermally coupled to the cooling structures of the semiconductor chip packages of the second group.

In Example 40, the subject-matter of Example 39 may further include that the first cooling element portion and the second cooling element portion are integrally formed.

In Example 41, the subject-matter of any of Examples 28 to 40 may further include that the cooling element includes aluminum, copper, an aluminum alloy and/or a copper alloy.

In Example 42, the subject-matter of any of Examples 28 to 41 may further include that the cooling element includes an electrically conductive coil.

In Example 43, the subject-matter of any of Examples 28 to 42 may further include that at least one of the encapsulations includes a mold material or a laminate.

In Example 44, the subject-matter of any of Examples 28 to 43 may further include that the cooling element is in thermal contact with at least one of the encapsulations.

In Example 45, the subject-matter of any of Examples 28 to 44 may further include that the cooling element is soldered or screwed to the at least one cooling structure of each of at least two of the plurality of semiconductor chip packages.

In Example 46, the subject-matter of any of Examples 28 to 45 may further include that the cooling structures include an opening for screwing the cooling element onto the cooling structures.

Example 47 is a method of forming a semiconductor device. The method may include mounting a plurality of semiconductor chip packages onto a carrier, herein carrier includes an electronic circuit, and each of the chip packages includes an encapsulation encapsulating the semiconductor chip, a plurality of contact strictures electrically connecting the semiconductor chip with the electronic circuit, and at least one cooling structure protruding from the encapsulation, and thermally conductively connecting a cooling element to at least one cooling structure of each of at least two of the plurality of semiconductor chip packages.

In Example 48, the subject-matter of Example 47 may further include that the mounting of the plurality of semiconductor chip packages includes surface-mounting the semiconductor chip packages to the carrier.

In Example 49, the subject-matter of Example 47 or 48 may further include that the carrier is a printed circuit board.

In Example 50, the subject-matter of any of Examples 47 to 49 may further include that the cooling element is electrically conductive.

In Example 51, the subject-matter of any of Examples 47 to 50 may further include that each of the cooling structures is electrically coupled with the semiconductor chip and with the electronic circuit, thereby forming a further contact structure.

In Example 52, the subject-matter of any of Examples 47 to 51 may further include that the plurality of cooling structures are electrically coupled with each other through the cooling element.

In Example 53, the subject-matter of any of Examples 47 to 52 may further include that each of the plurality of contact structures includes at least one controlling contact structure and at least one controlled contact structure, In Example 54, the subject-matter of Example 53 may further include that, e cooling structure is a further controlled contact structure.

In Example 55, the subject-matter of any of Examples 47 to 54 may further include that at least one of the plurality of semiconductor chip packages is a power semiconductor device.

In Example 56, the subject-matter of any of Examples 47 to 55 may further include that at least one of the plurality of semiconductor chip packages is a MOSFET, an IGBT, or a diode.

In Example 57, the subject-matter of any of Examples 47 to 56 may further include, before the mounting, arranging a first group of the plurality of semiconductor chip packages in a first row.

In Example 58, the subject-matter of Example 57 may further include that the arranging includes arranging all of the semiconductor chip packages of the first group with the same first orientation.

In Example 59, the subject-matter of Example 57 or 58 may further include that the cooling element includes a first cooling element portion thermally coupled to the cooling structures of the semiconductor chip packages of the first group.

In Example 60, the subject-matter of any of Examples 57 to 59 may further include, before the mounting, arranging a second group of the plurality of semiconductor chip packages in a second row.

In Example 61, the subject-matter of Example 60 may further include that the arranging includes arranging all of the semiconductor chip packages of the second group with the same second orientation, which is different from the first orientation In Example 62, the subject-matter of Example 60 or 61 may further include that the cooling element includes a second cooling element portion thermally coupled to the cooling structures of the semiconductor chip packages of the second group.

In Example 63, the subject-matter of Example 62 may further include that the first cooling element portion and the second cooling element portion are integrally formed.

In Example 64, the subject-matter of any of Examples 47 to 63 may further include that the cooling element includes aluminum, copper, an aluminum alloy and/or a copper alloy.

In Example 65, the subject-matter of any of Examples 47 to 64 may further include that the cooling element includes an electrically conductive coil.

In Example 66, the subject-matter of any of Examples 47 to 65 may further include that at least one of the encapsulations includes a mold material or a laminate.

In Example 67, the subject-matter of any of Examples 47 to 66 may further include directly contacting at least one of the encapsulations with the cooling element.

In Example 68, the subject-matter of any of Examples 47 to 67 may further include that the thermally conductively connecting the cooling element includes soldering the cooling element to the at least one cooling structure of each of the at least two of the plurality of semiconductor chip packages.

In Example 69, the subject-matter of any of Examples 47 to 68 may further include that the cooling structures include an opening for screwing the cooling element onto the cooling structures.

In Example 70, the subject-matter of any of Examples 47 to 69 may further include that the thermally conductively connecting the cooling element includes screwing the cooling element onto the at least one cooling structure of each of the at least two of the plurality of semiconductor chip packages.

In Example 71, the subject-matter of any of Examples 47 to 70 may further include that the electronic circuit and the plurality of semiconductor chip packages are connected to include parallel half-bridges.

In Example 72, the subject-matter of any of Examples 47 to 71 may further include that the electronic circuit and the plurality of semiconductor chip packages are connected to include a full-bridge.

Example 73 is a method of forming a semiconductor arrangement. The method may include mounting a plurality of semiconductor chip packages onto a cooling element, wherein each of the chip packages includes an encapsulation encapsulating the semiconductor chip, a plurality of contact structures for electrically contacting the semiconductor chip and at least one cooling structure protruding from the encapsulation, thereby thermally conductively connecting the cooling element to at least one cooling structure of each of at least two of the plurality of semiconductor chip packages and electrically connecting the at least one cooling structure of each of at least two of the plurality of semiconductor chip packages through the cooling element.

In Example 74, the subject-matter of Example 73 may further include that each of the plurality of semiconductor chip packages is a surface mount device configured to be surface-mounted to a carrier.

In Example 75, the subject-matter of Example 73 or 74 may further include that each of the plurality of contact structures includes at least one controlling contact structure and at least one controlled contact structure.

In Example 76, the subject-matter of any of Examples 73 to 75 may further include that the cooling structure is a further controlled contact structure.

In Example 77, the subject-matter of any of Examples 73 to 76 may further include that at least one of the plurality of semiconductor chip packages is a power semiconductor device.

In Example 78, the subject-matter of any of Examples 73 to 77 may further include that at least one of the plurality of semiconductor chip packages is a MOSFET, an IGBT, or a diode.

In Example 79, the subject-matter of any of Examples 73 to 78 may further include, before the mounting, arranging a first group of the plurality of semiconductor chip packages in a first row.

In Example 80, the subject-matter of Example 79 may further include that the arranging includes arranging all of the semiconductor chip packages of the first group with the same first orientation.

In Example 81, the subject-matter of Example 79 or 80 may further include that the cooling element includes a first cooling element portion thermally coupled to the cooling structures of the semiconductor chip packages of the first group.

In Example 82, the subject-matter of any of Examples 79 to 81 may further include, before the mounting, arranging a second group of the plurality of semiconductor chip packages in a second row.

In Example 83, the subject-matter of Example 82 may further include that the arranging includes arranging all of the semiconductor chip packages of the second group with the same second orientation.

In Example 84, the subject-matter of Example 82 or 83 may further include that the cooling element includes a second cooling element portion thermally coupled to the cooling structures of the semiconductor chip packages of the second group.

In Example 85, the subject-matter of Example 84 may further include that the first cooling element portion and the second cooling element portion are integrally formed.

In Example 86, the subject-matter of any of Examples 73 to 85 may further include that the cooling element includes aluminum, copper, an aluminum alloy and/or a copper alloy.

In Example 87, the subject-matter of any of Examples 73 to 86 may further include that the cooling element includes an electrically conductive coil.

In Example 88, the subject-matter of any of Examples 73 to 87 may further include that at least one of the encapsulations includes a mold material or a laminate.

In Example 89, the subject-matter of any of Examples 73 to 88 may further include that the cooling element is in thermal contact with at least one of the encapsulations.

In Example 90, the subject-matter of any of Examples 73 to 89 may further include that the mounting the plurality of semiconductor chip packages onto the cooling element includes soldering or screwing the cooling element to the at least one cooling structure of each of at least two of the plurality of semiconductor chip packages, In Example 91, the subject-matter of any of Examples 73 to 90 may further include that the cooling structures include an opening for screwing the cooling element onto the cooling structures.

Example 92 is a method of forming a semiconductor device, The method may include mounting a semiconductor arrangement according to any of Examples 27 to 46 to a carrier including an electronic circuit.

In Example 93, the subject-matter of Example 92 may further include that the mounting includes surface-mounting the plurality of semiconductor chip packages to the carrier.

Example 94 is a chip package. The chip package may include a semiconductor chip comprising on a front side a first connecting pad and a second connecting pad, a carrier comprising a pad contact area and a recess, encapsulation material encapsulating the semiconductor chip, a first external connection that is free from or extends out of the encapsulation material, an electrically conductive clip, and a contact structure, wherein the semiconductor chip is arranged with its front side facing the carrier with the first connecting pad over the recess and with the second connecting pad contacting the pad contact area, wherein the clip is arranged over a back side of the semiconductor chip covering the semiconductor chip where it extends over the recess, and wherein the electrically conductive contact structure electrically conductively connects the first connecting pad with the first external connection.

In Example 95, the subject-matter of Example 94 may further include that the second connecting pad is electrically conductively connected to a second external connection that is free from or extends out of the encapsulation material.

In Example 96, the subject-matter of Example 94 or 95 may further include that the semiconductor chip includes a transistor, and that the second connecting pad is a source pad of the transistor.

In Example 97, the subject-matter of any of Examples 94 to 96 may further include a third connecting pad on a back side opposite the front side of the semiconductor chip, wherein the clip electrically conductively connects the third connecting pad to a third external connection that is free from or extends out of the encapsulation material.

Example 98 is a semiconductor arrangement. The semiconductor arrangement may include a first cooling element, at least one first chip package including a first transistor chip, an encapsulation encapsulating the first transistor chip, and a first cooling structure exposed on a first side of the first chip package, wherein the first cooling structure is electrically conductively connected to a source contact of the first transistor chip, at least one second chip package including a second transistor chip, an encapsulation encapsulating the second transistor chip, and a second cooling structure exposed on a first side of the second chip package, wherein the second cooling structure is electrically conductively connected to a drain contact of the second transistor chip, wherein at least one of the at least one first chip package is mounted on the cooling element with the first cooling structure contacting the first cooling element on a first side, and wherein at least one of the at least one second chip package is mounted on the cooling element with the second cooling structure contacting the first cooling element on a second side opposite the first side.

In Example 99, the subject-matter of Example 98 may further include that the cooling element, the at least one first chip package mounted on the cooling element, and the at least one second chip package mounted on the cooling element form a half-bridge.

In Example 100, the subject-matter of Example 99 may further include a carrier including an electronic circuit that may form part of the half-bridge, wherein the first cooling element is mounted on the carrier.

Example 101 is a three-phase system. The three-phase system may include three semiconductor arrangements in accordance with Example 99, and a carrier including an electronic circuit, wherein the three semiconductor arrangements and the carrier may together be configured as the three-phase system.

In Example 102, the subject-matter of Example 101 may further include that the three-phase system forms an inverter.

In Example 103, the subject-matter of any of Examples 98 to 101 may further include that the at least one first chip package is a chip package in accordance with any of Examples 94 to 97.

Example 104 is a half-bridge module. The hall-bridge module may include a carrier having a top side, a first source pad and a first drain pad, a first transistor package including a first source contact surface exposed at a bottom side of the first transistor package and a first drain contact surface exposed at a top side of the first transistor package, wherein the first transistor package is mounted to the top side of the carrier with the first source contact surface electrically and mechanically contacting the first source pad, a second transistor package including a second source contact surface exposed at a top side of the second transistor package and a second drain contact surface exposed at a bottom side of the second transistor package, wherein the second transistor package is mounted to the top side of the carrier with the second drain contact surface electrically and mechanically contacting the first drain pad, wherein a portion of the first source pad is exposed at the top side at a first end of the carrier, and wherein a portion of the first drain pad is exposed at the top side at a second end of the carrier opposite the first end.

In Example 105, the subject-matter of Example 104 may further include at least one fixing structure at the first source pad and/or at he first drain pad, wherein the at least one fixing structure is configured to provide or enable a mechanical fixation and an electrically conductive coupling between the first source pad and a further first source pad of an adjacent further half-bridge module, and/or a mechanical fixation and an electrically conductive coupling between the first drain pad and a further first drain pad of the adjacent further half-bridge module.

In Example 106, the subject-matter of Example 105 may further include that the at least one fixing structure is at least one screw hole formed in the first source pad and/or in the first drain pad.

In Example 107, the subject-matter of Example 105 may further include that the at least one fixing structure is at least one locking element attached to the first source pad and/or to the first drain pad and configured to couple to a corresponding further locking element of the further half-bridge module.

In Example 108, the subject-matter of any of Examples 104 to 107 may further include that the first drain contact surface exposed at a top side of the first transistor package and the second source contact surface exposed at a top side of the second transistor package are arranged at the same distance from a top side surface of the carrier.

In Example 109, the subject-matter of Example 108 may further include that the carrier includes an insulated through hole for fixing a common conductor element to the half-bridge module, wherein the common conductor element is to be in electrically conductive contact with the first drain contact surface and the second source contact surface.

In Example 110, the subject-matter of Example 109 may further include the common conductor element.

In Example 111, the subject-matter of Example 110 may further include at least one conductor locking element attached to the common conductor element and configured to couple to a corresponding further conductor locking element of a further adjacent half-bridge module.

In Example 112, the subject-matter of Example 111 may further include that the at least one conductor locking element extends over at least one edge of the carrier that connects the first end and the second end.

In Example 113, the subject-matter of Example 111 or 112 may further include that the at least one conductor locking element includes two conductor locking elements extending over both edges of the carrier that connect the first end and the second end.

In Example 114, the subject-matter of any of Examples 104 to 113 may further include that the first transistor package is in accordance with the chip package of any of Examples 94 to 97.

Example 115 is a three-phase system including at least three half-bridge modules in accordance with any of Example 104 to 113, wherein the at least three half-bridge modules are coupled to form the three-phase system.

Example 116 is a three-phase system including at least six half-bridge modules in accordance with any of claims 104 to 113, wherein a first half-bridge module and a second half-bridge module of the at least six half-bridge modules are coupled in parallel to provide a first phase of the three-phase system, wherein a third half-bridge module and a fourth half-bridge module of the at least six half-bridge modules are coupled in parallel to provide a second phase of the three-phase system, and wherein a fifth half-bridge module and a sixth half-bridge module of the at least six half-bridge modules are coupled in parallel to provide a third phase of the three-phase system, wherein the first drain contact surface and the second source contact surface of each of the first half-bridge module and of the second half-bridge module are conductively coupled by a first common conductor element, wherein the first drain contact surface and the second source contact surface of each of the third half-bridge module and of the fourth half-bridge module are conductively coupled by a second common conductor element, and wherein the first drain contact surface and the second source contact surface of each of the fifth half-bridge module and of the sixth half-bridge module are conductively coupled by a third common conductor element.

In Example 117, the subject-matter of Example 115 or 116 may further include a further common conductor element conductively coupled to the first source pad of each of the first half-bridge module, the second half-bridge module, the third half-bridge module and the fourth half-bridge module.

In Example 118, the subject-matter of any of Examples 115 to 117 may further include a yet further common conductor element conductively coupled to the first drain pad of each of the third half-bridge module, the fourth half-bridge module the fifth half-bridge module, and the sixth half-bridge module.

Example 119 is a method of forming a chip package. The method may include arranging a semiconductor chip including on a front side a first connecting pad and a second connecting pad with its front side facing a carrier having a pad contact area and a recess, wherein the first connecting pad is arranged over the recess, and the second connecting pad is arranged contacting the pad contact area, arranging a clip over a back side of the semiconductor chip covering the semiconductor chip where it extends over the recess, and electrically conductively connecting the first connecting pad with a first external connection that is free from or extends out of the encapsulation material.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A half-bridge module, comprising:
a carrier comprising a top side, a first source pad and a first drain pad;
a first transistor package comprising a first source contact surface exposed at a bottom side of the first transistor package, and a first drain contact surface exposed at a top side of the first transistor package, wherein the first transistor package is mounted to the top side of the carrier with the first source contact surface electrically and mechanically contacting the first source pad; and
a second transistor package comprising a second source contact surface exposed at a top side of the second transistor package, and a second drain contact surface exposed at a bottom side of the second transistor package, wherein the second transistor package is mounted to the top side of the carrier with the second drain contact surface electrically and mechanically contacting the first drain pad,
wherein a portion of the first source pad is exposed at the top side at a first end of the carrier,
wherein a portion of the first drain pad is exposed at the top side at a second end of the carrier opposite the first end.

2. The half-bridge module of claim 1, further comprising:
at least one fixing structure at the first source pad and/or at the first drain pad,
wherein the at least one fixing structure is configured to provide or enable a mechanical fixation and an electrically conductive coupling between the first source pad and a further first source pad of an adjacent further half-bridge module, and/or a mechanical fixation and an electrically conductive coupling between the first drain pad and a further first drain pad of the adjacent further half-bridge module.

3. The half-bridge module of claim 2, wherein the at last one fixing structure is at least one screw hole formed in the first source pad and/or in the first drain pad.

4. The half-bridge module of claim 2, wherein the at least one fixing structure is at least one locking element attached to the first source pad and/or to the first drain pad and configured to couple to a corresponding further locking element of the further half-bridge module.

5. The half-bridge module of claim 1, wherein the first drain contact surface exposed at a top side of the first transistor package and the second source contact surface exposed at a top side of the second transistor package are arranged at a same distance from a top side surface of the carrier.

6. The half-bridge module of claim 5, wherein the carrier comprises an insulated through hole for fixing a common conductor element to the half-bridge module, and wherein the common conductor element is configured to be in electrically conductive contact with the first drain contact surface and the second source contact surface.

7. The half-bridge module of claim 5, further comprising:
a common conductor element in electrically conductive contact with the first drain contact surface and the second source contact surface.

8. The half-bridge module of claim 7, further comprising:
at least one conductor locking element attached to the common conductor element and configured to couple to a corresponding further conductor locking element of a further adjacent half-bridge module.

9. The half-bridge module of claim 8, wherein the at least one conductor locking element extends over at least one edge of the carrier that connects the first end and the second end of the carrier.

10. The half-bridge module of claim 8, wherein the at least one conductor locking element comprises two conductor locking elements extending over both edges of the carrier that connect the first end and the second end.

11. A three-phase system, comprising:
at least three half-bridge modules in accordance with claim 1;
wherein the at least three half-bridge modules are coupled to form the three-phase system.

12. A three-phase system, comprising:
at least six half-bridge modules in accordance with claim 1,
wherein a first half-bridge module and a second half-bridge module of the at least six half-bridge modules are coupled in parallel to provide a first phase of the three-phase system,
wherein a third half-bridge module and a fourth half-bridge module of the at least six half-bridge modules are coupled in parallel to provide a second phase of the three-phase system,
wherein a fifth half-bridge module and a sixth half-bridge module of the at least six half-bridge modules are coupled in parallel to provide a third phase of the three-phase system,
wherein the first drain contact surface and the second source contact surface of each of the first half-bridge module and of the second half-bridge module are conductively coupled by a first common conductor element,
wherein the first drain contact surface and the second source contact surface of each of the third half-bridge module and of the fourth half-bridge module are conductively coupled by a second common conductor element,
wherein the first drain contact surface and the second source contact surface of each of the fifth half-bridge module and of the sixth half-bridge module are conductively coupled by a third common conductor element.

13. The three-phase system of claim 12, further comprising:
a further common conductor element conductively coupled to the first source pad of each of the first half-bridge module, the second half-bridge module, the third half-bridge module and the fourth half-bridge module.

14. The three-phase system of claim 12, further comprising:
a further common conductor element conductively coupled to the first drain pad of each of the third half-bridge module, the fourth half-bridge module the fifth half-bridge module, and the sixth half-bridge module.

* * * * *